United States Patent
Saito et al.

(10) Patent No.: US 10,002,768 B2
(45) Date of Patent: Jun. 19, 2018

(54) SEMICONDUCTOR DEVICE AND MANUFACTURING METHOD THEREOF

(71) Applicant: Renesas Electronics Corporation, Koutou-ku, Tokyo (JP)

(72) Inventors: Kentaro Saito, Tokyo (JP); Hideki Sugiyama, Tokyo (JP); Hiraku Chakihara, Tokyo (JP); Yoshiyuki Kawashima, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days. days.

(21) Appl. No.: 15/796,621

(22) Filed: Oct. 27, 2017

(65) Prior Publication Data

US 2018/0053658 A1 Feb. 22, 2018

Related U.S. Application Data

(62) Division of application No. 15/236,472, filed on Aug. 14, 2016, now Pat. No. 9,831,093.

(30) Foreign Application Priority Data

Aug. 21, 2015 (JP) ................................. 2015-164157

(51) Int. Cl.
| H01L 21/28 | (2006.01) |
| H01L 49/02 | (2006.01) |
| H01L 27/11573 | (2017.01) |
| H01L 27/06 | (2006.01) |
| H01L 29/66 | (2006.01) |
| H01L 29/792 | (2006.01) |

(52) U.S. Cl.
CPC .... *H01L 21/28282* (2013.01); *H01L 27/0629* (2013.01); *H01L 27/11573* (2013.01); *H01L 28/60* (2013.01); *H01L 29/66833* (2013.01); *H01L 29/792* (2013.01)

(58) Field of Classification Search
None
See application file for complete search history.

(56) References Cited

U.S. PATENT DOCUMENTS

| 5,814,850 A * | 9/1998 | Iwasa .................. H01L 27/0218 257/296 |
| 9,177,807 B2 * | 11/2015 | Shinohara ......... H01L 21/28273 |
| 2007/0262382 A1 | 11/2007 | Ishii et al. |
| 2007/0278564 A1 | 12/2007 | Ishii et al. |

(Continued)

FOREIGN PATENT DOCUMENTS

| JP | 2009-099640 A | 5/2009 |
| JP | 2014-103204 A | 6/2014 |

*Primary Examiner* — Lex Malsawma
(74) *Attorney, Agent, or Firm* — Shapiro, Gabor and Rosenberger, PLLC

(57) ABSTRACT

In a semiconductor device, a memory cell is formed of a control gate electrode and a memory gate electrode adjacent to each other, a gate insulating film formed below the control gate electrode and an insulating film formed below the memory gate electrode and having a charge accumulating part therein. Also, in this semiconductor device, a capacitive element is formed of a lower electrode, an upper electrode and a capacitive insulating film formed between the upper electrode and the lower electrode. A thickness of the lower electrode is smaller than a thickness of the control gate electrode.

5 Claims, 26 Drawing Sheets

(56) References Cited

U.S. PATENT DOCUMENTS

| | | |
|---|---|---|
| 2009/0095995 A1 | 4/2009 | Kawashima et al. |
| 2010/0200909 A1* | 8/2010 | Kawashima ...... H01L 21/28282 |
| | | 257/326 |
| 2011/0260228 A1 | 10/2011 | Kawashima |
| 2011/0272753 A1 | 11/2011 | Funayama et al. |
| 2012/0299084 A1 | 11/2012 | Saito et al. |
| 2014/0138758 A1 | 5/2014 | Uozaki et al. |

* cited by examiner

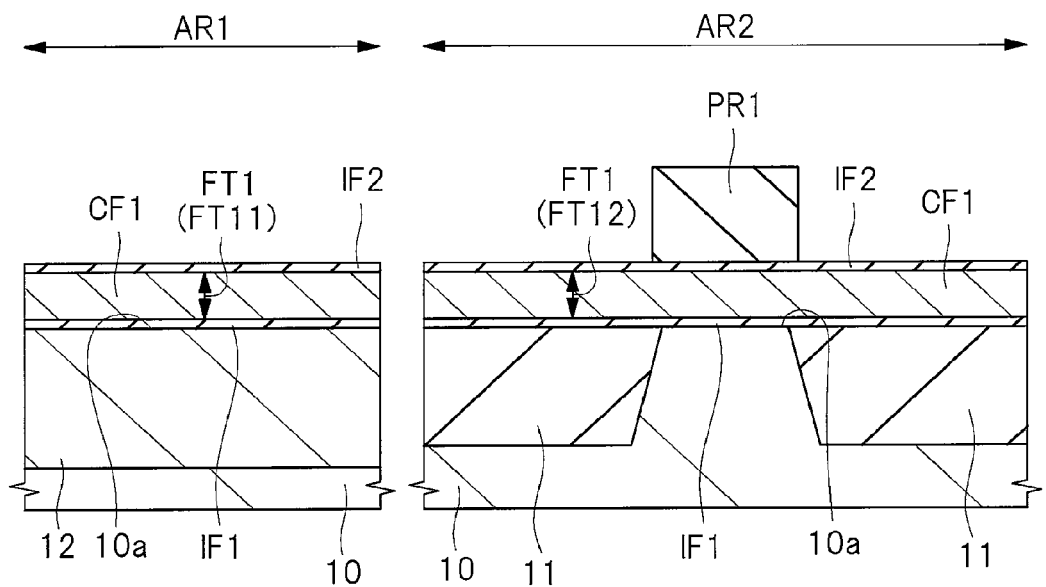
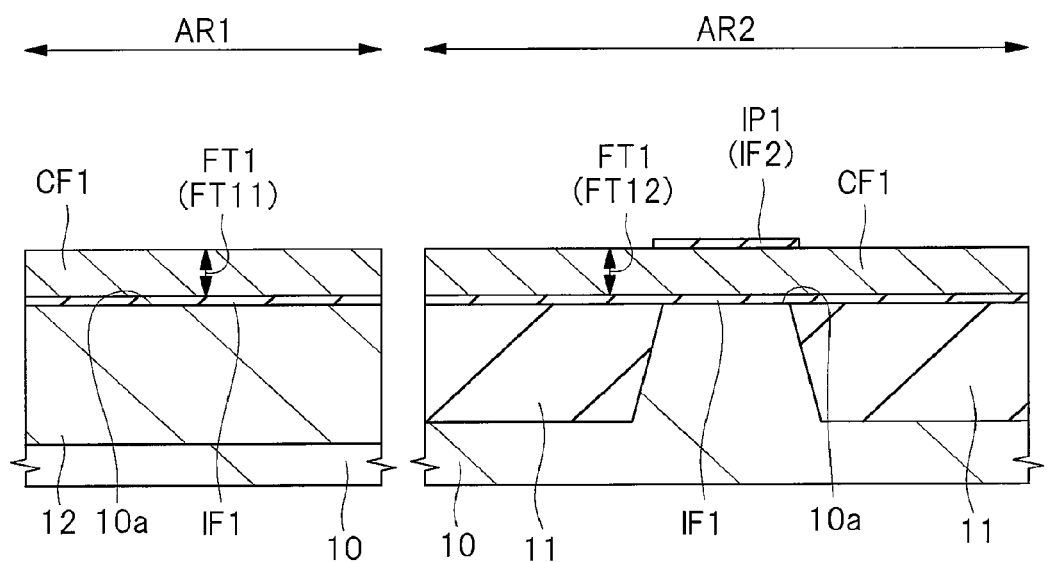

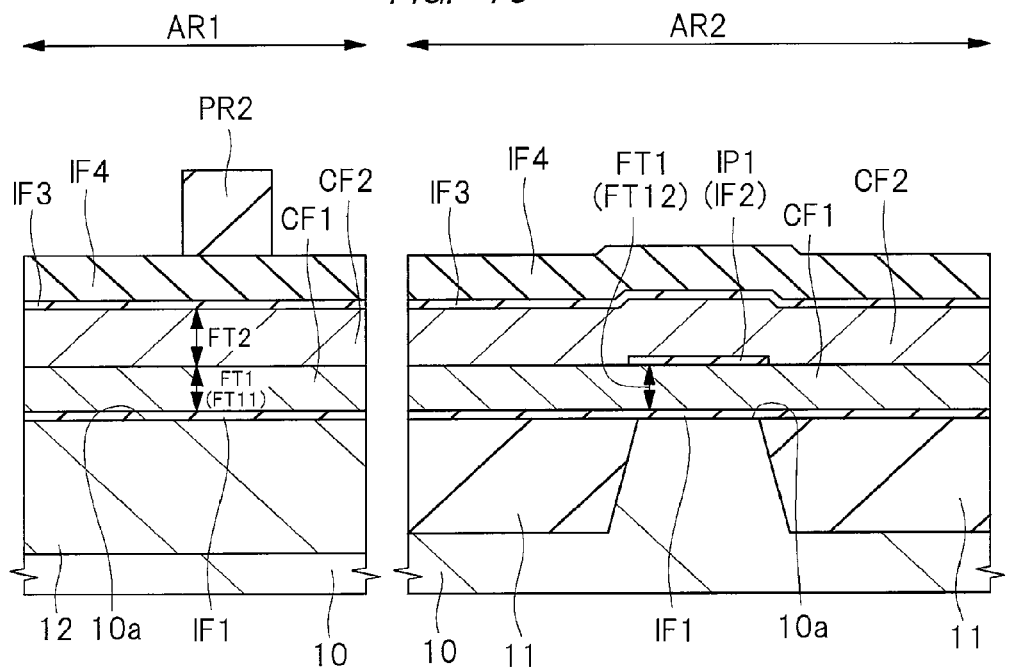
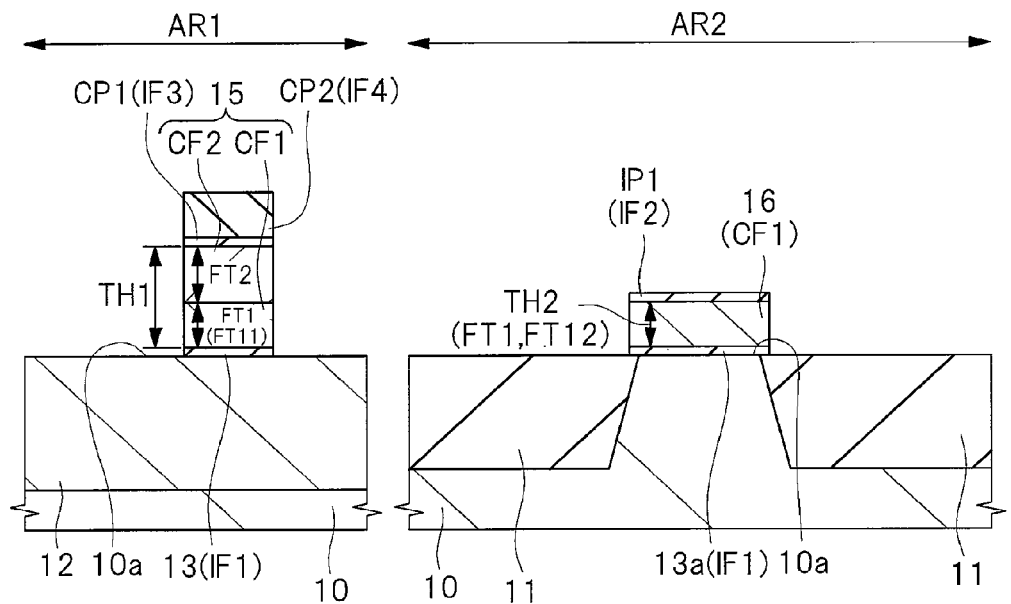

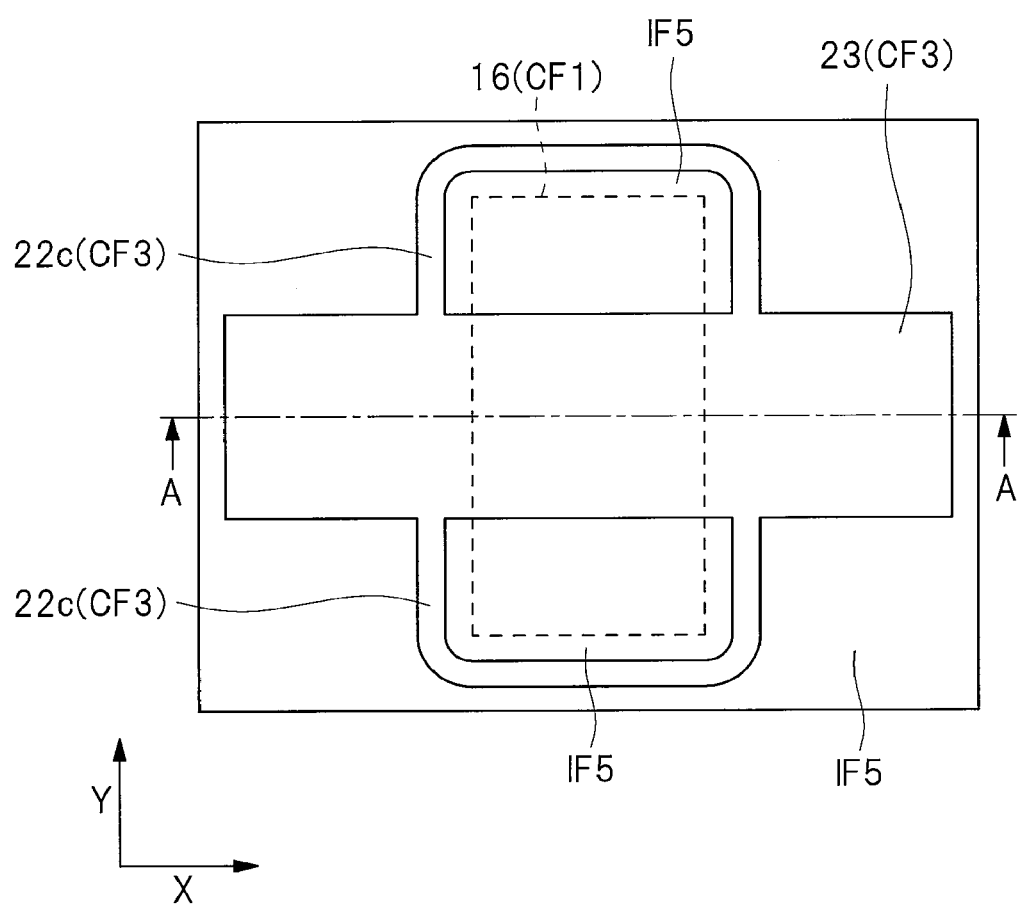

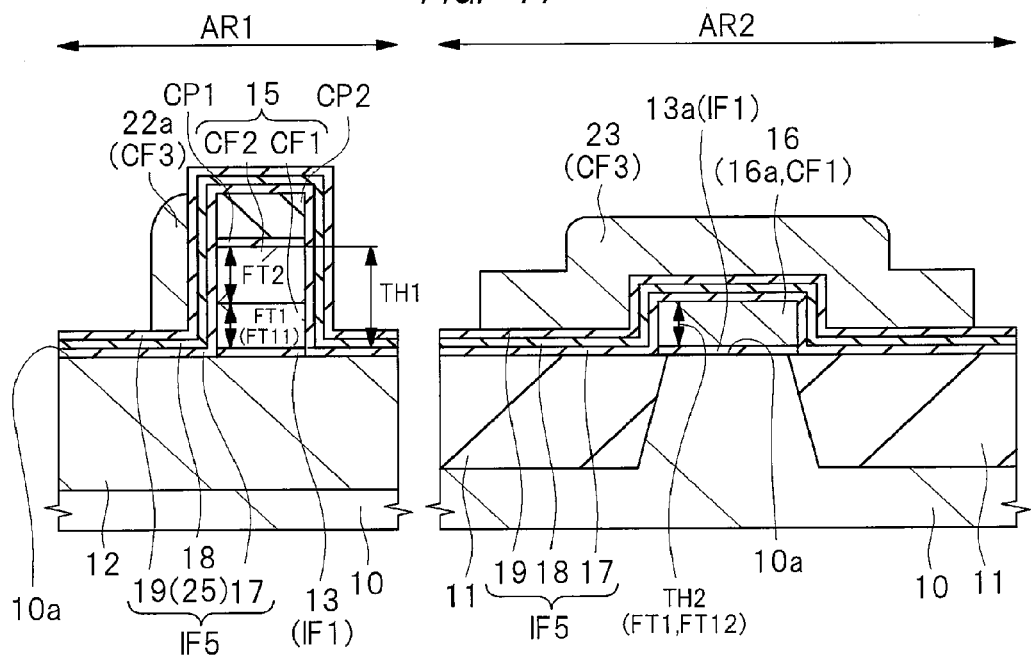
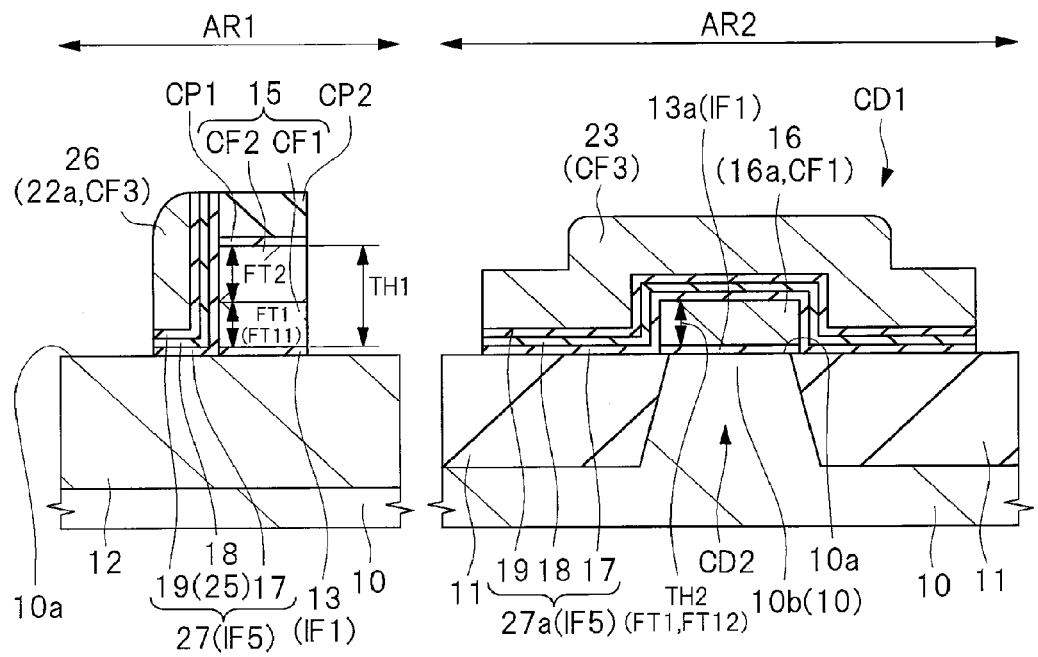

FIG. 19
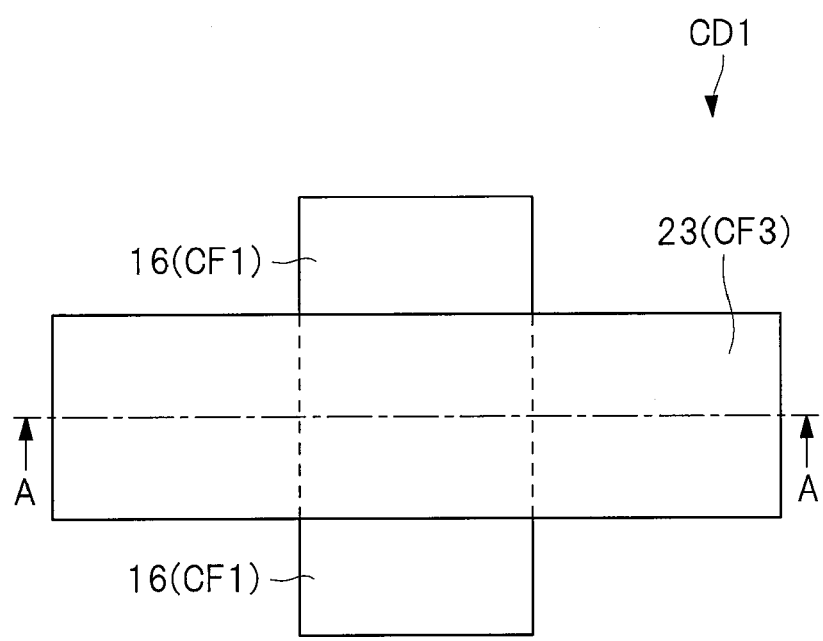
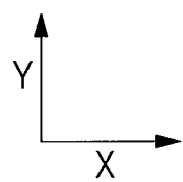

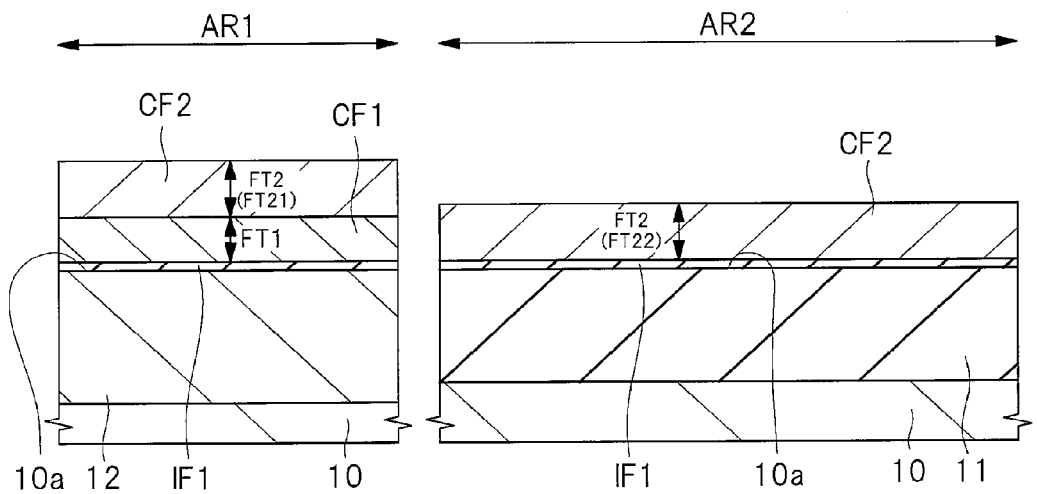
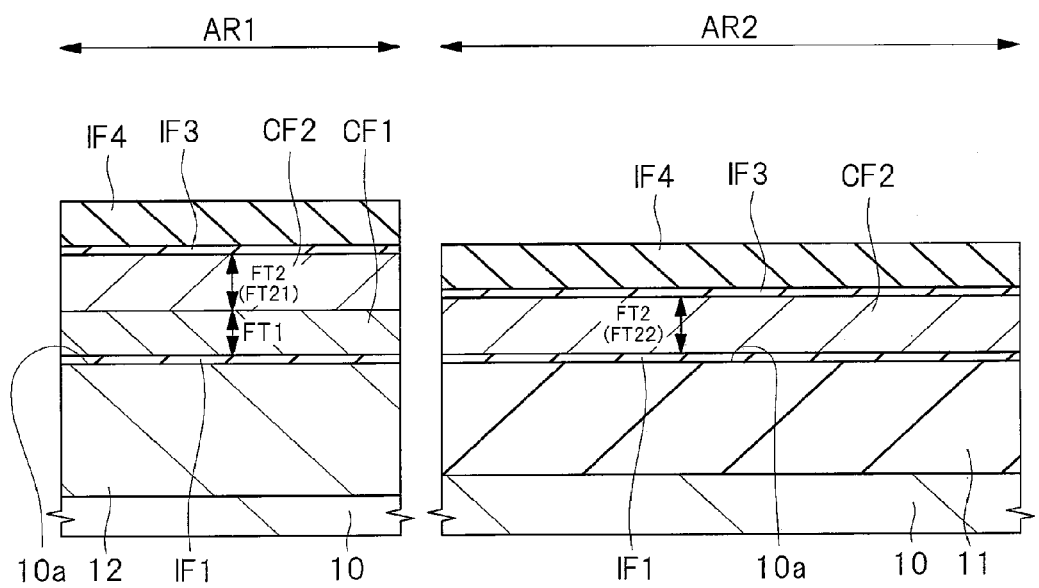

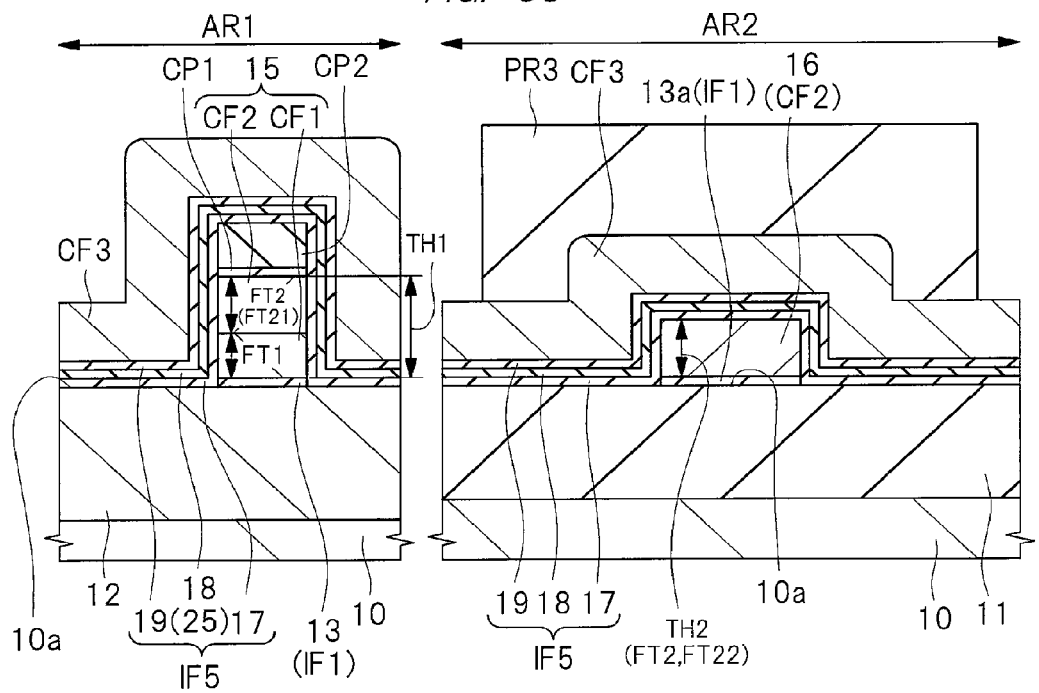
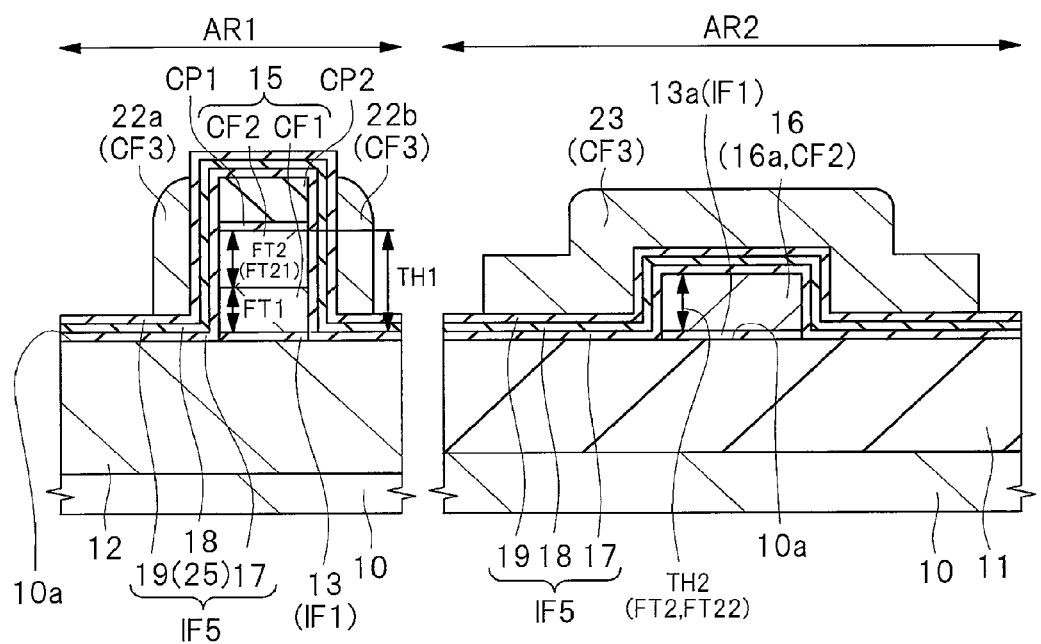

SEMICONDUCTOR DEVICE AND MANUFACTURING METHOD THEREOF

CROSS-REFERENCE TO RELATED APPLICATION

The present application claims priority from Japanese Patent Application No. 2015-164157 filed on Aug. 21, 2015, the content of which is hereby incorporated by reference into this application.

TECHNICAL FIELD OF THE INVENTION

The present invention relates to a semiconductor device and a manufacturing method thereof, and can be effectively applied to, for example, a semiconductor device provided with a capacitive element and a manufacturing method thereof.

BACKGROUND OF THE INVENTION

Some semiconductor devices have a microcomputer formed in one semiconductor chip. In this semiconductor chip having the microcomputer formed therein, a central processing unit (CPU) composed of a logic circuit such as a CMISFET (Complementary Metal Insulator Semiconductor Field Effect Transistor), a memory, an analog circuit or the like is formed.

Among these, for example, an electrically rewritable nonvolatile memory is used as the memory. In addition, a driving circuit such as a boosting circuit or an analog circuit is formed in the semiconductor chip in order to operate the nonvolatile memory, and a highly accurate capacitive element is necessary for the driving circuit or the analog circuit. Therefore, a capacitive element is formed in the semiconductor chip in addition to the nonvolatile memory described above.

Some of such capacitive elements are formed simultaneously with a memory cell of a nonvolatile memory by using a process of manufacturing the memory cell of the nonvolatile memory. The capacitive element is referred to as a PIP (Polysilicon Insulator Polysilicon) capacitive element because it uses a polycrystalline silicon (polysilicon) film for an upper electrode and a lower electrode.

Japanese Patent Application Laid-Open Publication No. 2009-99640 (Patent Document 1) discloses the technology for a semiconductor device provided with a capacitive element having a lower electrode formed on a semiconductor substrate, a capacitive insulating film formed on the lower electrode and an upper electrode formed on the capacitive insulating film. The lower electrode is made of a polysilicon film and the upper electrode is made of a polysilicon film.

Also, in some cases, a control gate electrode included in the nonvolatile memory cell is composed of a laminated film made up of two layers of polycrystalline silicon films (polysilicon films) in order to suppress the increase of crystal grain diameter (grain size) in the control gate electrode.

In the technology for a semiconductor device having a nonvolatile memory disclosed in Japanese Patent Application Laid-Open Publication No. 2014-103204 (Patent Document 2), the nonvolatile memory has a selection gate electrode including a first polysilicon film and a second polysilicon film which are sequentially stacked on a semiconductor substrate via a first insulating film.

SUMMARY OF THE INVENTION

The case in which the control gate electrode included in the memory cell is composed of a laminated film made up of polycrystalline silicon films (polysilicon films) as two layers of conductive films and the capacitive element is formed simultaneously with the memory cell of the nonvolatile memory as described above will be considered. In such a case, the lower electrode of the capacitive element is also composed of the laminated film made up of polycrystalline silicon films as two layers of conductive films. Further, the conductive film of the first layer included in the lower electrode of the capacitive element is formed in the same layer as the conductive film of the first layer included in the control gate electrode, and the conductive film of the second layer included in the lower electrode of the capacitive element is formed in the same layer as the conductive film of the second layer included in the control gate electrode.

In such a case, the thickness of the lower electrode is approximately equal to the thickness of the control gate electrode and the height position of the upper surface of the capacitive element is higher than the height position of the upper surface of the memory cell in some cases, and it is necessary to sufficiently increase the thickness of an interlayer insulating film. Therefore, there is the fear that, when forming a contact hole in the interlayer insulating film, the positional accuracy of the bottom portion of the contact hole is degraded, so that the performance of the semiconductor device is deteriorated. On the other hand, if the thickness of the interlayer insulating film is not sufficiently increased, there is the fear that the upper surface of the lower electrode is exposed when the interlayer insulating film is planarized, so that the performance of the semiconductor device is deteriorated.

Other problems and novel features will be apparent from the description of the present specification and the attached drawings.

According to an embodiment, in a semiconductor device, a nonvolatile memory is formed of a first gate electrode and a second gate electrode adjacent to each other, a first gate insulating film formed under the first gate electrode, and a second gate insulating film formed under the second gate electrode and having a charge accumulating part therein. In addition, in the semiconductor device, a capacitive element is formed of a first electrode, a second electrode and a capacitive insulating film formed between the second electrode and the first electrode. A thickness of the first electrode is smaller than a thickness of the first gate electrode.

Also, according to another embodiment, in a manufacturing method of a semiconductor device, a first conductive film and a second conductive film are sequentially formed, and the second conductive film and the first conductive film are patterned. Then, in a first region, a first gate electrode including the first conductive film and the second conductive film is formed and a first gate insulating film under the first gate electrode is formed, and a first electrode including the first conductive film is formed in a second region. Next, a second insulating film having a charge accumulating part therein and a third conductive film are sequentially formed, the third conductive film is patterned to leave the third conductive film on a side surface of the first gate electrode via the second insulating film, thereby forming a second gate electrode, and a second electrode is formed above the first electrode by patterning the third conductive film in the second region.

Further, according to another embodiment, in a manufacturing method of a semiconductor device, a first conductive film is formed in a first region, a second conductive film covering the first conductive film is formed in the first region and a second region, and the second conductive film and the first conductive film are patterned. Then, in the first region, a first gate electrode including the first conductive film and the second conductive film is formed and a first gate insulating film under the first gate electrode is formed, and a first electrode including the second conductive film is formed in the second region. Next, a second insulating film having a charge accumulating part therein and a third conductive film are sequentially formed, the third conductive film is patterned to leave the third conductive film on a side surface of the first gate electrode via the second insulating film, thereby forming a second gate electrode, and a second electrode is formed above the first electrode by patterning the third conductive film in the second region.

According to an embodiment, it is possible to improve the performance of the semiconductor device.

BRIEF DESCRIPTIONS OF THE DRAWINGS

FIG. 6 is a cross-sectional view in the manufacturing process of the semiconductor device according to the first embodiment;

FIG. 7 is a cross-sectional view in the manufacturing process of the semiconductor device according to the first embodiment;

FIG. 10 is a cross-sectional view in the manufacturing process of the semiconductor device according to the first embodiment;

FIG. 11 is a cross-sectional view in the manufacturing process of the semiconductor device according to the first embodiment;

FIG. 16 is a plan view in the manufacturing process of the semiconductor device according to the first embodiment;

FIG. 17 is a cross-sectional view in the manufacturing process of the semiconductor device according to the first embodiment;

FIG. 18 is a cross-sectional view in the manufacturing process of the semiconductor device according to the first embodiment;

FIG. 19 is a plan view in the manufacturing process of the semiconductor device according to the first embodiment;

FIG. 30 is a cross-sectional view in the manufacturing process of the semiconductor device according to the second embodiment;

FIG. 31 is a cross-sectional view in the manufacturing process of the semiconductor device according to the second embodiment;

FIG. 38 is a cross-sectional view in the manufacturing process of the semiconductor device according to the second embodiment;

FIG. 39 is a cross-sectional view in the manufacturing process of the semiconductor device according to the second embodiment;

DESCRIPTIONS OF THE PREFERRED EMBODIMENTS

Figure 1:
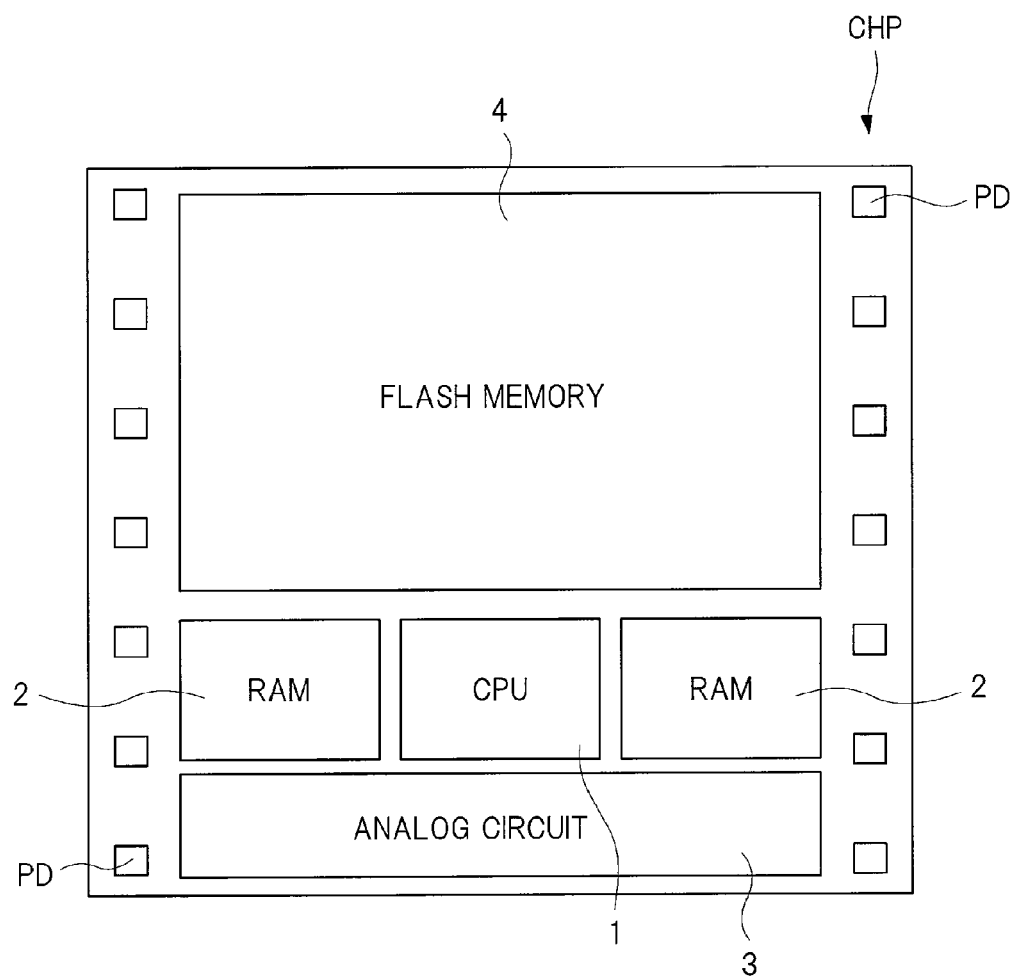
FIG. 1 is a plan view of a semiconductor chip serving as a semiconductor device according to the first embodiment.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle, and the number larger or smaller than the specified number is also applicable.

Further, in the embodiments described below, the components (including element steps) are not always indispensable unless otherwise stated or except the case where the components are apparently indispensable in principle. Similarly, in the embodiments described below, when the shape of the components, positional relation thereof and the like are mentioned, the substantially approximate and similar shapes and the like are included therein unless otherwise stated or except the case where it is conceivable that they are apparently excluded in principle. The same goes for the numerical values and ranges described above.

Hereinafter, typical embodiments will be described in detail based on the drawings. Note that the components having the same function are denoted by the same reference characters throughout the drawings for describing the embodiments, and the repetitive description thereof will be omitted. In addition, the description of the same or similar portions is not repeated in principle unless particularly required in the following embodiments.

Further, in the drawings used in the following embodiments, hatching is omitted in some cases even in a cross-sectional view so as to make the drawings easy to see.

(First Embodiment)

<Configuration of Semiconductor Device>

FIG. 1 is a plan view of a semiconductor chip serving as a semiconductor device according to the first embodiment. For example, FIG. 1 shows a layout configuration of respective elements formed in a semiconductor chip CHP serving as a semiconductor device having a microcomputer therein.

In FIG. 1, the semiconductor chip CHP serving as a semiconductor device includes a CPU 1, a RAM (Random Access Memory) 2, an analog circuit 3 and a flash memory 4 as a type of a nonvolatile memory. Further, pads PD serving as input/output external terminals used to connect these circuits and external circuits are formed in a peripheral part of the semiconductor chip.

The CPU 1 is referred to also as a central processing unit and corresponds to a heart of a computer. The CPU 1 reads and decodes instructions from a storage device and performs a variety of operations and controls based on the instructions, and thus it is required to have a high processing speed. Therefore, a relative large current driving power is necessary for the MISFET (Metal Insulator Semiconductor Field Effect Transistor) constituting the CPU 1 among the elements formed in the semiconductor chip CHP. Namely, the MISFET constituting the CPU 1 is formed of a low-withstand-voltage MISFET.

The RAM 2 is a memory which can read and write information at random, that is, can read the stored information and can newly write the information as needed, and it is referred to also as a randomly writable/readable memory. The RAM as an IC (Integrated Circuit) memory includes two types such as the DRAM (Dynamic RAM) using a dynamic circuit and the SRAM (Static RAM) using a static circuit. The DRAM is a randomly writable/readable memory in which the memory holding operation is necessary, and the SRAM is a randomly writable/readable memory in which the memory holding operation is unnecessary. Since the RAM 2 is required to have a high operation speed, a relative large current driving power is necessary for the MISFET constituting the RAM 2 among the elements formed in the semiconductor chip CHP. Namely, a low-withstand-voltage MISFET is used for the MISFET constituting the RAM 2.

The analog circuit 3 is a circuit which handles a signal of voltage and current changed temporally in succession, that is, an analog signal, and it is composed of, for example, an amplifier circuit, a converter circuit, a modulator circuit, an oscillator circuit or a power source circuit. Among the elements formed in the semiconductor chip CHP, a relatively high-withstand-voltage MISFET is used as the MISFET constituting the analog circuit 3.

The flash memory 4 is a type of nonvolatile memory electrically rewritable for both of the write operation and the erase operation, and it is referred to also as an electrically erasable programmable read-only memory. The memory cells of the flash memory 4 include a MISFET for memory cell selection and a MONOS (Metal Oxide Nitride Oxide Semiconductor) FET (Field Effect Transistor) for storage. For example, the hot electron injection or the Fowler-Nordheim tunneling phenomenon is used for the write operation of the flash memory, and the Fowler-Nordheim tunneling phenomenon or the hot hole injection is used for the erase operation.

In order to operate the flash memory 4 described above, a driving circuit such as a boosting circuit is formed in the semiconductor chip CHP. A highly accurate capacitive element is necessary for the driving circuit. In addition, a highly accurate capacitive element is necessary also for the analog circuit 3 described above. Therefore, the capacitive element is also formed in the semiconductor chip CHP in addition to the memory cell and the MISFET of the flash memory 4 described above. One of the characteristics of the first embodiment lies in the structure of the capacitive element as a PIP capacitive element formed in the semiconductor chip CHP. Hereinafter, the configuration of the capacitive element as a PIP capacitive element formed in the semiconductor chip CHP will be described. Note that the PIP capacitive element is simply referred to as a capacitive element in the following description.

<Configuration of Capacitive Element and Memory Cell>

As described later, the capacitive element is simultaneously formed in the process of forming the memory cell of the flash memory 4 in some cases. Therefore, the descriptions will be given with reference to the illustrations of the capacitive element and the memory cell of the flash memory 4 formed in the semiconductor chip CHP.

Figure 2:
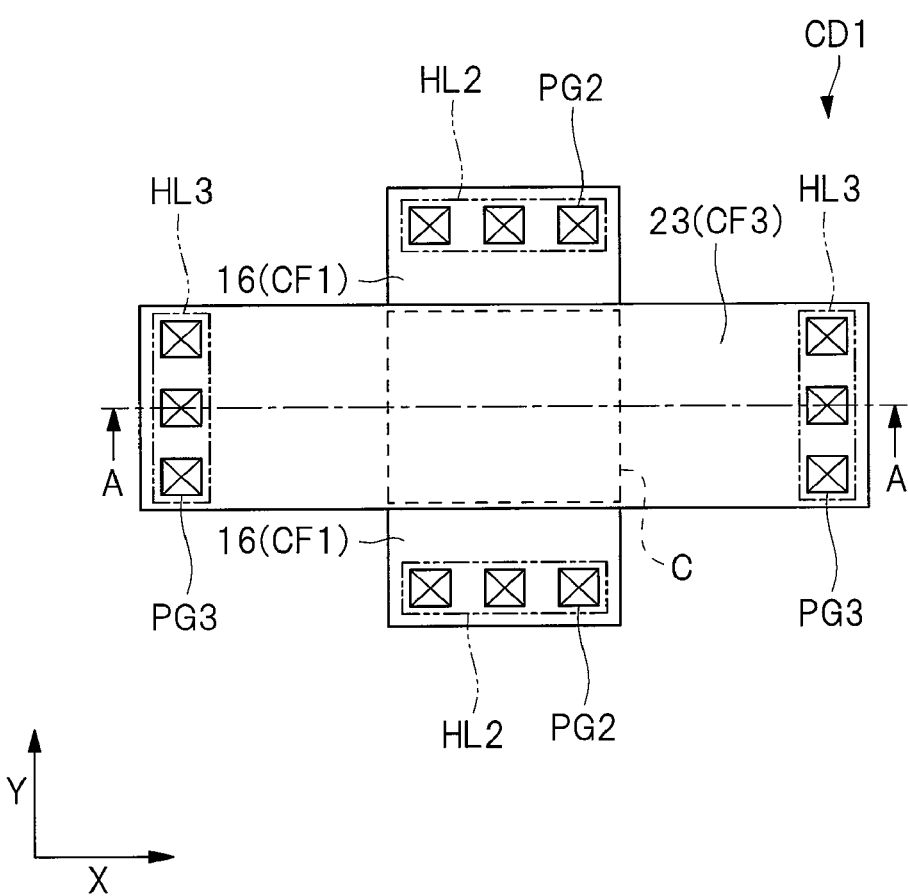
FIG. 2 is a plan view of a capacitive element in the semiconductor device according to the first embodiment.
Figure 3:
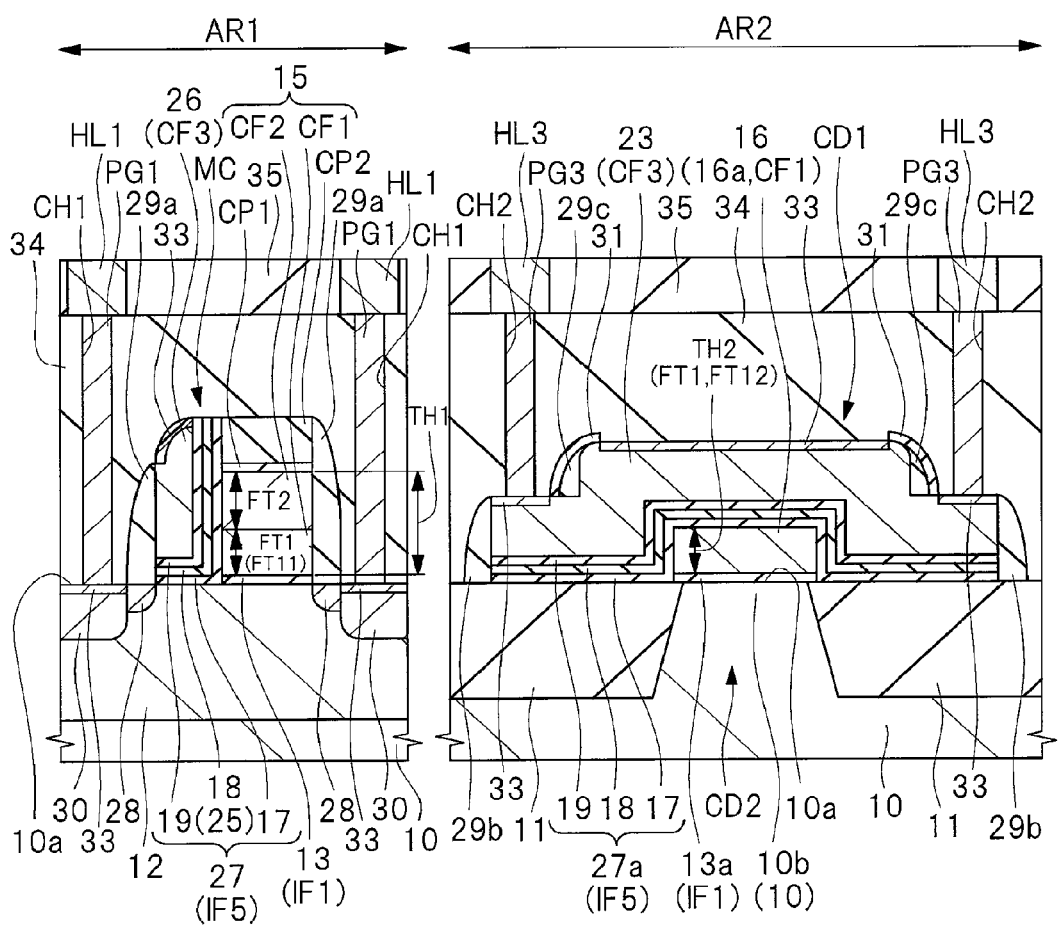
FIG. 3 is a cross-sectional view of a capacitive element and a memory cell in the semiconductor device according to the first embodiment.

FIG. 2 is a plan view of a capacitive element in the semiconductor device according to the first embodiment. FIG. 3 is a cross-sectional view of a capacitive element and a memory cell in the semiconductor device according to the first embodiment. In FIG. 3, the cross-sectional view of the capacitive element in a capacitive element forming region AR2 corresponds to the cross-sectional view taken along the line A-A in FIG. 2.

Note that the plan view of FIG. 2 shows the state where an interlayer insulating film 34 (see FIG. 3) and sidewalls 29b (see FIG. 3) are removed or the state seen through them, wirings HL2 and HL3 are indicated by two-dot chain lines, and illustrations of a semiconductor substrate 10 (see FIG. 3) and an element isolation region 11 (see FIG. 3) are also omitted (the same is true of the following plan views).

First, a configuration of the capacitive element will be described.

As shown in FIG. 2 and FIG. 3, the semiconductor device includes a lower electrode 16, an upper electrode 23 and a capacitive insulating film 27a as an insulator part. A capacitive element CD1 is formed of the lower electrode 16, the upper electrode 23 and the capacitive insulating film 27a.

The lower electrode 16 and the upper electrode 23 each have different rectangular shapes, and an overlapping region in which the lower electrode 16 and the upper electrode 23 are overlapped when seen in a plan view and a non-overlapping region in which the lower electrode 16 and the upper electrode 23 are not overlapped when seen in a plan view are provided. Namely, when two directions intersecting with each other, preferably orthogonally, when seen in a plan view are defined as an X axis direction and a Y axis direction as shown in FIG. 2, the length of the upper electrode 23 is larger than the length of the lower electrode 16 in the X axis direction and the length of the upper electrode 23 is smaller than the length of the lower electrode 16 in the Y axis direction (direction intersecting with the X axis direction). A capacitor C of the capacitive element CD1 is formed in the overlapping region in which the lower electrode 16 and the upper electrode 23 are overlapped when seen in a plan view.

In this specification, the expression "when seen in a plan view" means a case seen from the direction perpendicular to an upper surface 10a serving as a main surface of the semiconductor substrate 10.

Plugs PG2 electrically connected to the lower electrode 16 are formed in the non-overlapping region of the lower electrode 16, and plugs PG3 electrically connected to the upper electrode 23 are formed in the non-overlapping region of the upper electrode 23. The plug PG2 electrically connected to the lower electrode 16 is connected to the wiring HL2, and the plug PG3 electrically connected to the upper electrode 23 is connected to the wiring HL3.

For example, in the case where the upper electrode 23 has a shape enclosed by the lower electrode 16 when seen in a plan view, the upper electrode 23 has only the overlapping region in which the upper electrode 23 and the lower electrode 16 are overlapped when seen in a plan view. Consequently, the plug PG3 electrically connected to the upper electrode 23 is formed on this overlapping region. In other words, the plug PG3 connected to the upper electrode 23 is formed on a PIP capacitive element formed in the overlapping region. If the plug PG3 connected to the upper electrode 23 is formed in such a case, there is the fear that the capacitive insulating film 27a in contact with the bottom surface of the plug PG3 is damaged. Since the capacitive insulating film 27a has an important role in the characteristics of the PIP capacitive element, the characteristics of the capacitive element CD1 are deteriorated if the capacitive insulating film 27a is damaged.

On the other hand, in the first embodiment, the upper electrode 23 and the lower electrode 16 are formed to have different rectangular shapes as shown in FIG. 2, so that the overlapping region and the non-overlapping region are formed. Then, the capacitor C of the capacitive element CD1 is formed in the overlapping region, and the non-overlapping region of the upper electrode 23 serves as a lead-out region of the upper electrode 23. By forming the plug PG3 connected to the upper electrode 23 in the lead-out region formed in the non-overlapping region, it is possible to prevent the capacitive insulating film 27a of the capacitive element CD1 formed in the overlapping region from being damaged.

As shown in FIG. 3, the semiconductor device includes the semiconductor substrate 10 and the element isolation region 11. The element isolation region 11 is formed in the upper surface 10a serving as the main surface of the semiconductor substrate 10. The semiconductor substrate 10 is made of, for example, single crystal silicon (Si) and the element isolation region 11 is made of, for example, a silicon oxide film. In addition, the semiconductor substrate 10 has a memory cell forming region AR1 in which the memory cell MC is formed and a capacitive element forming region AR2 in which the capacitive element CD1 is formed. The memory cell forming region AR1 is a region of the upper surface 10a of the semiconductor substrate 10, and the capacitive element forming region AR2 is another region of the upper surface 10a of the semiconductor substrate 10 different from the memory cell forming region AR1.

In the capacitive element forming region AR2, an insulator part 13a is formed on an active region sandwiched between two element isolation regions 11, that is, on the semiconductor substrate 10. The insulator part 13a includes, for example, an insulating film IF1 such as a silicon oxide film.

In the capacitive element forming region AR2, the lower electrode 16 is formed on the insulator part 13a. The lower electrode 16 includes one layer of a conductive film CF1. The conductive film CF1 included in the lower electrode 16 is formed above the semiconductor substrate 10 in the capacitive element forming region AR2. The conductive film CF1 is a conductive film formed in the same process as that of forming the conductive film CF1 included in a control gate electrode 15 described later. The conductive film CF1 is made of, for example, a polycrystalline silicon (polysilicon) film. Specifically, a thickness FT1 of the conductive film CF1 in a direction perpendicular to the upper surface 10a of the semiconductor substrate 10 can be set to, for example, about 36 to 44 nm.

The capacitive insulating film 27a is formed on the lower electrode 16. In addition, when seen in a plan view, the capacitive insulating film 27a is disposed so as to intersect with the lower electrode 16, that is, so as to cross over the lower electrode 16. The capacitive insulating film 27a includes an insulating film IF5. The insulating film IF5 includes, for example, a silico oxide film 17, a silicon nitride film 18 formed on the silicon oxide film 17 and a silicon oxide film 19 formed on the silicon nitride film 18. Namely, the insulating film IF5 is a laminated film of the silicon oxide film 17, the silicon nitride film 18 and the silicon oxide film 19. Specifically, the thickness of the insulating film IF5 can be set to, for example, about 18 to 22 nm.

The upper electrode 23 is formed on the capacitive insulating film 27a. As described above, since the capacitive insulating film 27a is disposed so as to intersect with the lower electrode 16, that is, so as to cross over the lower electrode 16 when seen in a plan view, the upper electrode 23 formed on the capacitive insulating film 27a is also disposed so as to intersect with the lower electrode 16, that is, so as to cross over the lower electrode 16 when seen in a plan view. The upper electrode 23 includes one layer of a conductive film CF3. The conductive film CF3 is made of, for example, a polycrystalline silicon film. Specifically, the thickness of the conductive film CF3 can be set to, for example, about 52 to 64 nm.

A part of the upper electrode 23 overlapped with the lower electrode 16 when seen in a plan view is formed above a part of the lower electrode 16 overlapped with the upper electrode 23 when seen in a plan view. Also, the capacitive insulating film 27a is formed between the part of the upper electrode 23 overlapped with the lower electrode 16 when seen in a plan view and the part of the lower electrode 16 overlapped with the upper electrode 23 when seen in a plan view.

In addition, the capacitive element CD1 in the first embodiment is provided with a capacitive element CD2 which includes the semiconductor substrate 10 as a lower electrode 10b and includes the lower electrode 16 formed on the semiconductor substrate 10 via the insulating film IF1 as an upper electrode 16a. At this time, the insulator part 13a including the insulating film IF1 serves as a capacitive insulating film of the capacitive element CD2. Namely, the capacitive element CD2 is formed of the lower electrode 10b, the upper electrode 16a and the insulator part 13a. Also, the lower electrode 10b is made of the semiconductor substrate 10 below the upper electrode 16a and the insulator part 13a is formed between the lower electrode 10b and the upper electrode 16a.

As described above, in the first embodiment, the capacitive elements CD1 and CD2 are formed and stacked in the direction perpendicular to the upper surface 10a of the semiconductor substrate 10. Therefore, by connecting the capacitive element CD1 and the capacitive element CD2 in parallel, the capacitive element having a larger capacitance value in comparison with the case in which the capacitive element CD2 is not formed can be formed without changing the occupied area. The capacitive element CD1 and the capacitive element CD2 can be connected in parallel by making the semiconductor substrate 10 and the upper electrode 23 have the same potential.

On a side wall or a side surface of the lower electrode 16, a sidewall (not shown) made of an insulating film such as a silicon oxide film is formed. Similarly, on a side wall or a side surface of the upper electrode 23 and the capacitive insulating film 27a, a sidewall 29b made of an insulating film such as a silicon oxide film is formed. The sidewall 29b has a function to improve the insulation between the upper electrode 23 and the lower electrode 16. Note that a sidewall 29c made of an insulating film such as a silicon oxide film is formed on the side wall or the side surface of the lower electrode 16 via the capacitive insulating film 27a and the upper electrode 23. In other words, in a stepped-part region at the boundary between the overlapping region and the non-overlapping region of the upper electrode 23, the sidewall 29c covering the upper electrode 23 is formed.

Since the length of the lower electrode 16 is larger than the length of the upper electrode 23 in the Y axis direction, the overlapping region overlapped with the upper electrode 23 and the non-overlapping region in which the upper electrode 23 is not formed on the lower electrode 16 are present in the region in which the lower electrode 16 is formed as shown in FIG. 2. Therefore, the capacitor C of the capacitive element CD1 is formed in the overlapping region in which the lower electrode 16 and the upper electrode 23 are overlapped when seen in a plan view.

On the surface of the conductive film CF3 included in the upper electrode 23, a metal silicide film 33 made of, for example, a cobalt silicide film is formed. The metal silicide film 33 is provided for reducing the resistance of the upper electrode 23. Note that, in the stepped-part region at the boundary between the overlapping region and the non-overlapping region of the upper electrode 23, a silicon oxide film 31 which covers the upper electrode 23 via the sidewall 29c is formed. Therefore, the metal silicide film 33 is formed on the surface of the part of the upper electrode 23 exposed from the silicon oxide film 31. Though not shown, a cobalt silicide film is formed also on apart of the lower electrode 16 in the non-overlapping region which is not overlapped with the upper electrode 23 when seen in a plan view, and this cobalt silicide film reduces the resistance of the lower electrode 16.

Next, the wiring structure connected to the capacitive element CD1 will be described.

On the element isolation region 11, the interlayer insulating film 34 made of, for example, a silicon oxide film is formed so as to cover the capacitive element CD1. In this interlayer insulating film 34, a contact hole CH2 serving as a connection hole is formed. The contact hole CH2 penetrates through the interlayer insulating film 34 to reach the metal silicide film 33 formed on the surface of the conductive film CH3 included in the upper electrode 23. Though not shown, a contact hole penetrating through the interlayer insulating film 34 to reach the lower electrode 16 is also formed.

In the contact hole CH2, the plug PG3 which is made of a conductive film embedded in the contact hole CH2, is electrically connected to the upper electrode 23 and serves as a connection electrode is formed. Note that the plug PG2 (see FIG. 2) which is made of a conductive film embedded in the contact hole, is electrically connected to the lower electrode 16 and serves as a connection electrode is formed in the contact hole (not shown) reaching the lower electrode 16.

As this conductive film, a titanium/titanium nitride film serving as a barrier conductor film is first formed, and a tungsten film is next formed so as to fill the contact hole CH2. By filling the contact hole CH2 with a titanium/titanium nitride film and a tungsten film in the above-described manner, the plug PG3 which is made of a conductive film embedded in the contact hole CH2 and is electrically connected to the upper electrode 23 is formed. In this case, the titanium/titanium nitride film means a laminated film of a titanium film and a titanium nitride film or a film containing a titanium portion and a titanium nitride portion. Further, by filling the contact hole (not shown) reaching the lower electrode 16 with a titanium/titanium nitride film and a tungsten film, the plug PG2 (see FIG. 2) electrically connected to the lower electrode 16 is formed.

The wiring HL2 (see FIG. 2) and the wiring HL3 are formed on the interlayer insulating film 34, the wiring HL2 is electrically connected to the plug PG2, and the wiring HL3 is electrically connected to the plug PG3. Each of the wirings HL2 and HL3 is made of, for example, a laminated film of a titanium/titanium nitride film, an aluminum film and a titanium/titanium nitride film. In addition, an insulating film 35 made of, for example, a silicon oxide film is formed on the interlayer insulating film 34 and between adjacent wirings HL1.

Next, the structure of the memory cell MC as a flash memory will be described.

As shown in FIG. 3, the semiconductor device includes a p type well 12, a gate insulating film 13, the control gate electrode 15, a memory gate electrode 26, an insulating film 27 serving as a gate insulating film and low concentration impurity diffusion regions 28 and high concentration impurity diffusion regions 30 serving as a source region and a drain region. The memory cell MC is formed of the control gate electrode 15, the gate insulating film 13, the memory gate electrode 26 and the insulating film 27.

As shown in FIG. 3, in the memory cell forming region AR1, the p type well 12 is formed in the upper surface 10a of the semiconductor substrate 10, and the memory cell MC is formed on the p type well 12. The memory cell MC is composed of a selection part to select the memory cell MC and a storage part to store information.

First, the configuration of the selection part to select the memory cell MC will be described.

The gate insulating film 13 is formed on the semiconductor substrate 10, that is, on the p type well 12. The gate insulating film 13 includes an insulating film IF1 made of, for example, a silicon oxide film and formed in the same layer as the insulating film IF1 between the lower electrode 16 and the semiconductor substrate 10. In other words, the insulating film IF1 included in the insulator part 13a of the capacitive element CD1 is formed in the same layer as the insulating film IF1 included in the gate insulating film 13 of the memory cell MC.

The control gate electrode 15 is formed on the gate insulating film 13. The control gate electrode 15 has a function to select the memory cell MC. Namely, a specific memory cell MC is selected by the control gate electrode 15, and the write operation, the erase operation or the read operation is performed to the selected memory cell MC. More specifically, the control gate electrode 15 is formed above the semiconductor substrate 10 in the memory cell forming region AR1, and the gate insulating film 13 is formed between the control gate electrode 15 and the semiconductor substrate 10.

The control gate electrode 15 includes two layers of conductive films CF1 and CF2 stacked in the direction perpendicular to the upper surface 10a of the semiconductor substrate 10. The part of the conductive film CF1 included in the control gate electrode 15 is formed above the semiconductor substrate 10 in the memory cell forming region AR1 and the conductive film CF2 is formed on the conductive film CF1.

Each of the conductive films CF1 and CF2 is made of a polycrystalline silicon (polysilicon) film. When the control gate electrode 15 includes the two layers of conductive films CF1 and CF2, the thickness of each of the conductive films CF1 and CF2 becomes smaller in comparison with the case in which the control gate electrode 15 includes only one layer of a conductive film. Therefore, since the degree of freedom of the growth of crystal grains in the polycrystalline silicon film is reduced, the growth of crystal grains can be suppressed even when exposed to high temperature of nitriding treatment or the like, and the crystal grain diameter (grain size) can be reduced.

By reducing the crystal grain diameter (grain size) in this manner, the impurity can be easily diffused to the bottom of the control gate electrode 15 in the case of the ion implantation to the control gate electrode 15 including the conductive films CF1 and CF2 and in the case of the heat treatment to diffuse the impurity introduced by the ion implantation. Accordingly, since it is possible to prevent the depletion at the bottom of the control gate electrode 15 and also possible to prevent the fluctuation of the threshold voltage of the MISFET having the control gate electrode 15 as a gate electrode thereof, the reliability of the semiconductor device can be improved.

Preferably, the thickness FT1 of the conductive film CF1 is smaller than the thickness FT2 of the conductive film CF2 in the direction perpendicular to the upper surface 10a of the semiconductor substrate 10. Specifically, the conductive films CF1 and CF2 are formed so that the thickness FT1 of the conductive film CF1 is set to, for example, about 36 to 44 nm, the thickness FT2 of the conductive film CF2 is set to, for example, about 43 to 53 nm and the thickness FT1 of the conductive film CF1 is smaller than the thickness FT2 of the conductive film CF2.

As a result, the crystal grain diameter (grain size) in the conductive film CF1 as a lower layer can be made smaller than the crystal grain diameter in the conductive film CF2 as an upper layer. Therefore, the impurity can be easily diffused to the bottom of the control gate electrode 15. Accordingly, it is possible to easily prevent the depletion at the bottom of the control gate electrode 15 and also possible to prevent or suppress the fluctuation of the threshold voltage of the MISFET having the control gate electrode 15 as a gate electrode thereof in comparison with the case in which the thickness FT1 of the conductive film CF1 is equal to the thickness FT2 of the conductive film CF2. Thus, the reliability of the semiconductor device can be further improved in comparison with the case in which the thickness FT1 of the conductive film CF1 is equal to or larger than the thickness FT2 of the conductive film CF2.

In addition, the conductive film CF1 included in the control gate electrode 15 is formed in the same layer as the conductive film CF1 included in the lower electrode 16, but the conductive film CF2 included in the control gate electrode 15 is not formed in the same layer as the conductive film included in the lower electrode 16. Namely, the conductive film CF1 included in the control gate electrode 15 is the conductive film formed in the same process as that of forming the conductive film CF1 included in the lower electrode 16, but the conductive film CF2 included in the control gate electrode 15 is not the conductive film formed in the same process as that of forming the conductive film CF1 included in the lower electrode 16. In other words, the lower electrode 16 includes the conductive film CF1 formed in the same layer as the conductive film CF1 included in the control gate electrode 15, but does not include the conductive film formed in the same layer as the conductive film CF2 included in the control gate electrode 15.

Therefore, when the thickness of the control gate electrode 15 in the direction perpendicular to the upper surface 10a of the semiconductor substrate 10 is defined as TH1 and the thickness of the lower electrode 16 in the direction perpendicular to the upper surface 10a of the semiconductor substrate 10 is defined as TH2, the thickness TH2 is smaller than the thickness TH1. In addition, when the thickness FT1 of the conductive film CF1 included in the control gate electrode 15 is referred to as FT11 and the thickness FT1 of the conductive film CF1 included in the lower electrode 16 is referred to as FT12, the thickness FT12 is equal to the thickness FT11 and is smaller than the thickness FT2 of the conductive film CF2 included in the control gate electrode 15. Also, the conductive film CF1 included in the control gate electrode 15 and the conductive film CF1 included in the lower electrode 16 are made of the same material.

Note that the expression "the thickness FT12 is equal to the thickness FT11" means that the difference between the thickness FT12 and the thickness FT11 is within the range of ±10% with respect to the average values of the thickness FT12 and the thickness FT11.

Next, the configuration of the storage part of the memory cell will be described.

On one side surface of the control gate electrode 15, the memory gate electrode 26 is formed via the insulating film 27. The memory gate electrode 26 has a sidewall-like shape formed on one side surface of the control gate electrode 15 and includes the conductive film CF3 made of, for example, a polycrystalline silicon film. Namely, the memory gate electrode 26 is formed above the semiconductor substrate 10 and is adjacent to the control gate electrode 15 in the memory cell forming region AR1.

Note that the metal silicide film 33 made of, for example, a cobalt silicide film is formed on the surface of the conductive film CF3 included in the memory gate electrode 26. The metal silicide film 33 is provided for reducing the resistance of the memory gate electrode 26.

The insulating film 27 serving as the gate insulating film is formed between the control gate electrode 15 and the memory gate electrode 26 and between the memory gate electrode 26 and the semiconductor substrate 10. The insulating film 27 includes the insulating film IF5 formed in the same process as that of forming the insulating film IF5 included in the capacitive insulating film 27a. In other words, the insulating film IF5 included in the capacitive insulating film 27a of the capacitive element CD1 is formed in the same process as that of forming the insulating film IF5 included in the insulating film 27 of the memory cell MC.

The insulating film IF5 includes, for example, the silicon oxide film 17, a charge accumulating film 25 (silicon nitride film 18) formed on the silicon oxide film 17 and the silicon oxide film 19 formed on the charge accumulating film 25. Namely, the insulating film IF5 is a laminated film of the silicon oxide film 17, the silicon nitride film 18 and the silicon oxide film 19 and has the charge accumulating film 25 as a charge accumulating part therein.

The silicon oxide film 17 functions as a gate insulating film formed between the memory gate electrode 26 and the semiconductor device 10. The gate insulating film made of the silicon oxide film 17 has also a function as a tunnel insulating film. Since information is stored and erased in the storage part of the memory cell MC by injecting electrons to the charge accumulating film 25 and injecting holes to the charge accumulating film 25 through the silicon oxide film 17 from the semiconductor substrate 10, the silicon oxide film 17 functions as a tunnel insulating film.

The charge accumulating film 25 has a function to accumulate the charge. Specifically, in the first embodiment, the charge accumulating film 25 is formed of the silicon nitride film 18. In the storage part of the memory cell MC in the first embodiment, information is stored by controlling the current flowing in the semiconductor substrate 10 below the memory gate electrode 26, that is, the current flowing in the p type well 12 depending on the presence or absence of the charge accumulated in the charge accumulating film 25. Namely, information is stored by using the change of the threshold voltage of the current flowing in the semiconductor substrate 10 below the memory gate electrode 26 depending on the presence or absence of the charge accumulated in the charge accumulating film 25.

In the first embodiment, an insulating film having a trap level is used as the charge accumulating film 25. As an example of the insulating film having a trap level, the silicon nitride film 18 is used, but an aluminum oxide (alumina) film or the like may be used other than a silicon nitride film. When an insulating film having a trap level is used as the charge accumulating film 25, the charge is trapped in the trap level formed in the insulating film. By trapping the charge in the trap level in this manner, the charge is accumulated in the insulating film.

On one side wall of both side walls of the control gate electrode 15, that is, on one side surface thereof, the memory gate electrode 26 is formed, and on the other side wall or the other side surface, a sidewall 29a made of, for example, an insulating film such as a silicon oxide film is formed. Similarly, on one side wall of both side walls of the memory gate electrode 26, that is, on one side surface thereof, the control gate electrode 15 is formed, and on the other side wall or the other side surface, the sidewall 29a made of, for example, an insulating film such as a silicon oxide film is formed.

In the semiconductor substrate 10 right below the sidewalls 29a, a pair of shallow low concentration impurity diffusion regions 28 serving as n type semiconductor regions is formed, and a pair of deep high concentration impurity diffusion regions 30 is formed in the outer region in contact with the pair of shallow low concentration impurity diffusion regions 28. The deep high concentration impurity diffusion regions 30 also serve as n type semiconductor regions, and the metal silicide film 33 made of, for example, a cobalt silicide film is formed on the surface of the high concentration impurity diffusion region 30. The source region and the drain region of the memory cell are formed of the pair of low concentration impurity diffusion regions 28 and the pair of high concentration impurity diffusion regions 30. By forming the source region and the drain region from the low concentration impurity diffusion regions 28 and the high concentration impurity diffusion regions 30, the source region and the drain region can have the LDD (Lightly Doped Drain) structure.

Note that one of the source region and the drain region is formed in alignment with the control gate electrode 15 and the other thereof is formed in alignment with the memory gate electrode 26.

Here, the transistor composed of the gate insulating film 13, the control gate electrode 15 and the source and drain regions described above is referred to as a selection transistor. On the other hand, the transistor composed of the insulating film 27, the memory gate electrode 26 and the source and drain regions described above is referred to as a memory transistor. Thus, it can be said that the selection part of the memory cell MC is composed of the selection transistor and the storage part of the memory cell MC is composed of the memory transistor. The memory cell MC is constituted in this manner.

Next, the wiring structure connected to the memory cell MC will be described.

The interlayer insulating film 34 made of, for example, a silicon oxide film is formed on the semiconductor substrate 10 so as to cover the memory cell MC. In this interlayer insulating film 34, a contact hole CH1 serving as a connection hole is formed. The contact hole CH1 penetrates through the interlayer insulating film 34 to reach the metal silicide film 33 formed on each surface of the high concentration impurity diffusion regions 30 constituting the source region and the drain region.

In the contact hole CH1, a plug PG1 which is made of a conductive film embedded in the contact hole CH1, is electrically connected to the metal silicide film 33 formed on the surface of the high concentration impurity diffusion region 30 and serves as a connection electrode is formed. As this conductive film, a titanium/titanium nitride film serving as a barrier conductor film is first formed, and a tungsten film is next formed so as to fill the contact hole CH1. By filling the contact hole CH1 with a titanium/titanium nitride film and a tungsten film in the above-described manner, the plug PG1 which is made of a conductive film embedded in the contact hole CH1 and is electrically connected to the source region or the drain region is formed.

A wiring HL1 is formed on the interlayer insulating film 34, and the wiring HL1 is electrically connected to the plug PG1. The wiring HL1 is made of a laminated film of a titanium/titanium nitride film, an aluminum film and a titanium/titanium nitride film. In addition, the insulating film 35 is formed on the interlayer insulating film 34, between adjacent wirings HL1 and between adjacent wirings HL3.

Next, the operation of the memory cell MC will be described. Here, the voltage applied to the control gate electrode 15 is defined as Vcg and the voltage applied to the memory gate electrode 26 is defined as Vmg. Further, the voltages applied to the source region and the drain region are defined as Vs and Vd, respectively, and the voltage applied to the semiconductor substrate 10, that is, the p type well 12 is defined as Vb. Injection of electrons to the silicon nitride film 18 serving as the charge accumulating film 25 is defined as "write operation", and injection of holes to the silicon nitride film 18 is defined as "erase operation".

First, the write operation will be described. The write operation is performed by the hot electron writing referred to as the so-called source-side injection. As the writing voltage, for example, the voltage Vs applied to the source region is 6 V, the voltage Vmg applied to the memory gate electrode 26 is 12 V, and the voltage Vcg applied to the control gate electrode 15 is 1.5 V. Further, the voltage Vd applied to the drain region is controlled so that the channel current in the writing has a certain set value. The voltage Vd at this time is determined by the set value of the channel current and the threshold voltage of the selection transistor having the control gate electrode 15, and is, for example, about 1 V. The voltage Vb applied to the p type well 12, that is, the semiconductor substrate 10 is 0 V.

The movement of the charge at the time when the write operation is performed by applying the voltages will be described. As described above, by giving the potential difference between the voltage Vs applied to the source region and the voltage Vd applied to the drain electrode, electrons flow in the channel region formed between the source region and the drain region. The electrons flowing in the channel region are accelerated to be hot electrons in the channel region below the boundary between the control gate electrode 15 and the memory gate electrode 26. Then, the hot electrons are injected to the charge accumulating film 25 below the memory gate electrode 26, that is, to the silicon nitride film 18 by the electric field due to the positive voltage (Vmg=12 V) applied to the memory gate electrode 26. The injected hot electrons are trapped by the trap level in the silicon nitride film 18, so that the electrons are accumulated in the silicon nitride film 18 and the threshold voltage of the memory transistor is increased. In this manner, the write operation is performed.

Subsequently, the erase operation will be described. The erase operation is performed by, for example, the BTBT (Band to Band Tunneling) erase using the band to band tunneling phenomenon. In the BTBT erase, for example, the voltage Vmg applied to the memory gate electrode 26 is −6 V, the voltage Vs applied to the source region is 6 V and the voltage Vcg applied to the control gate electrode 15 is 0 V, and 0 V is applied to the drain region. Thus, holes generated by the band to band tunneling phenomenon at the end portion of the source region by the voltage applied between the source region and the memory gate electrode are accelerated to be hot holes by the high voltage applied to the source region. Then, a part of the hot holes are attracted by the negative voltage applied to the memory gate electrode 26 and injected to the silicon nitride film 18. The injected hot holes are trapped by the trap level in the silicon nitride film 18 and the threshold voltage of the memory transistor is decreased. In this manner, the erase operation is performed.

Next, the read operation will be described. In the read operation, the voltage Vd applied to the drain region is Vdd (1.5 V), the voltage Vs applied to the source region is 0 V, the voltage Vcg applied to the control gate electrode 15 is Vdd (1.5 V) and the voltage Vmg applied to the memory gate electrode 26 is Vdd (1.5 V), and the read operation is performed by sending a current in the direction opposite to that of the write operation. By exchanging the voltage Vd applied to the drain region and the voltage Vs applied to the source region to be 0 V and 1.5 V, respectively, the read operation with the same current direction as that of the write operation may be performed. At this time, when the memory cell is in the write state and threshold voltage is high, no current flows in the memory cell. Meanwhile, when the memory cell is in the erase state and the threshold voltage is low, the current flows in the memory cell.

<Manufacturing Method of Semiconductor Device>

Next, the manufacturing method of a semiconductor device according to the first embodiment will be described.

FIGS. 4 to 15, 17, 18 and 20 to 25 are cross-sectional views in the manufacturing process of the semiconductor device according to the first embodiment. FIGS. 16 and 19 are plan views in the manufacturing process of the semiconductor device according to the first embodiment. FIGS. 4 to 15, 17, 18 and 20 to 25 show the cross section corresponding to FIG. 3, and FIGS. 16 and 19 show the plane corresponding to FIG. 3.

Figure 4:
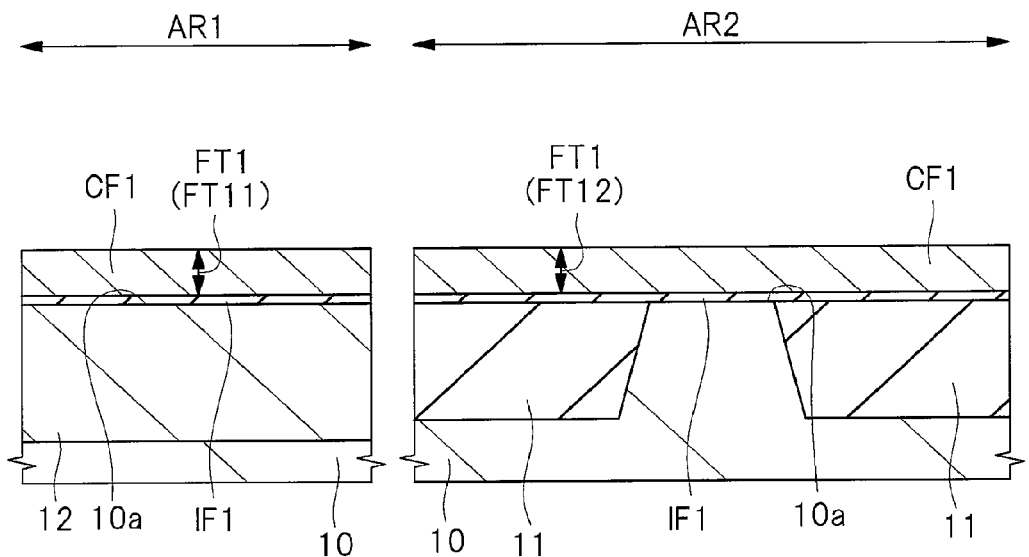
FIG. 4 is a cross-sectional view in the manufacturing process of the semiconductor device according to the first embodiment.

First, as shown in FIG. 4, the semiconductor substrate 10 made of single crystal silicon to which a p type impurity such as boron (B) is introduced is prepared. The semiconductor substrate 10 has the memory cell forming region AR1 which is a region of the upper surface 10a serving as the main surface of the semiconductor substrate 10 and the capacitive element forming region AR2 which is another region of the upper surface 10a serving as the main surface of the semiconductor substrate 10 and is a region different from the memory cell forming region AR1. Then, the element isolation region 11 is formed in the upper surface 10a serving as the main surface of the semiconductor substrate 10. The element isolation region 11 is provided for preventing the interference between respective elements. The element isolation region 11 can be formed by, for example, the LOCOS (Local Oxidation of Silicon) method or the STI (Shallow Trench Isolation) method.

For example, in the STI method, the element isolation region 11 is formed in the following manner. Namely, an element isolation trench is formed in the semiconductor substrate 10 by using the photolithography technique and the etching technique. Then, a silicon oxide film is formed on the semiconductor substrate 10 so as to fill the element isolation trench, and thereafter the unnecessary silicon oxide film formed on the semiconductor substrate 10 is removed by the CMP (Chemical Mechanical Polishing) method. In this manner, the element isolation region 11 in which the silicon oxide film is embedded only in the element isolation trench can be formed.

Note that FIG. 4 shows the region in which the element isolation region 11 is not formed in the memory cell forming region AR1 of the upper surface 10a of the semiconductor substrate 10. In addition, FIG. 4 shows the region in which the element isolation region 11 is not formed in the capacitive element forming region AR2 and the region in which the element isolation region 11 is formed in the capacitive element forming region AR2.

Next, the p type well 12 is formed by introducing an impurity into the semiconductor substrate 10. The p type well 12 is formed by introducing a p type impurity such as boron into the semiconductor substrate 10 by the ion implantation method. Then, in the memory cell forming region AR1, the semiconductor region (not shown) for forming a channel of a selection transistor is formed in a surface region of the p type well 12. The semiconductor region for forming a channel is formed to adjust the threshold voltage for forming the channel.

Next, in the memory cell forming region AR1 and the capacitive element forming region AR2, the insulating film IF1 is formed on the semiconductor substrate 10. The insulating film IF1 is made of, for example, a silicon oxide film and can be formed by, for example, the thermal oxidation method.

However, the insulating film IF1 is not limited to a silicon oxide film and can be changed to various films. For example, a silicon oxynitride film (SiON) may be used as the insulating film IF1. Namely, the structure in which nitrogen is segregated at the interface between the insulating film IF1 and the semiconductor substrate 10 is also applicable. The silicon oxynitride film has a higher effect of suppressing the occurrence of interface state in the film and reducing the electron trap in comparison with a silicon oxide film. Therefore, the hot carrier resistance of the insulating film IF1 and the insulation resistance can be improved. In addition, an impurity is less likely to be diffused in the silicon oxynitride film in comparison with the silicon oxide film. Thus, by using the silicon oxynitride film for the insulating film IF1 included in the gate insulating film 13 (see FIG. 11 described later), the fluctuation of the threshold voltage due to the diffusion of the impurity in the control gate electrode 15 (see FIG. 11 described later) to the semiconductor substrate 10 can be suppressed.

For example, the silicon oxynitride film can be formed by performing the heat treatment to the semiconductor substrate 10 in the atmosphere containing nitrogen such as NO, $NO_2$ or $NH_3$. Alternatively, the same effect can be obtained by forming the insulating film IF1 made of a silicon oxide film on the surface of the semiconductor substrate 10 and then performing the heat treatment to the semiconductor substrate 10 in the atmosphere containing nitrogen to segregate the nitrogen at the interface between the insulating film IF1 and the semiconductor substrate 10.

Also, the insulating film IF1 may be formed of a high-dielectric-constant film with a dielectric constant higher than that of a silicon nitride film. In this manner, since the physical thickness can be improved without changing the capacitance, the leakage current can be reduced.

For example, a hafnium oxide ($HfO_2$) film which is one of hafnium-based oxides is used as the high-dielectric-constant film. In addition, other hafnium-based oxides such as a hafnium aluminate (HfAlO) film, a hafnium oxynitride (HfON) film, a hafnium silicate (HfSiO) film and a hafnium silicon oxynitride (HfSiON) film can also be used instead of the hafnium oxide film. Furthermore, the hafnium-based oxide film obtained by introducing an oxide such as tantalum oxide, niobium oxide, titanium oxide, zirconium oxide, lanthanum oxide or yttrium oxide into the hafnium-based insulating films can also be used. Since the hafnium-based insulating film has a dielectric constant higher than that of a silicon oxide film and a silicon oxynitride film like the hafnium oxide film, the same effect as that of the case of using the hafnium oxide film can be obtained.

Next, in the memory cell forming region AR1 and the capacitive element forming region AR2, the conductive film CF1 made of, for example, a polycrystalline silicon film is formed on the insulating film IF1. In other words, in the memory cell forming region AR1 and the capacitive element forming region AR2, the conductive film CF1 covering the insulating film IF1 is formed above the semiconductor substrate 10. The conductive film CF1 made of a polycrystalline silicon film can be formed by the CVD (Chemical Vapor Deposition) method. Then, by using the photolithography technique and the ion implantation method, an n type impurity such as phosphorus or arsenic is introduced into the conductive film CF1 made of a polycrystalline silicon film. Specifically, the thickness FT1 of the conductive film CF1 can be set to, for example, about 36 to 44 nm. Note that the thickness FT1 of a part of the conductive film CF1 formed in the memory cell forming region AR1 is referred to as the thickness FT11, and the thickness FT1 of a part of the conductive film CF1 formed in the capacitive element forming region AR2 is referred to as the thickness FT12.

Figure 5:
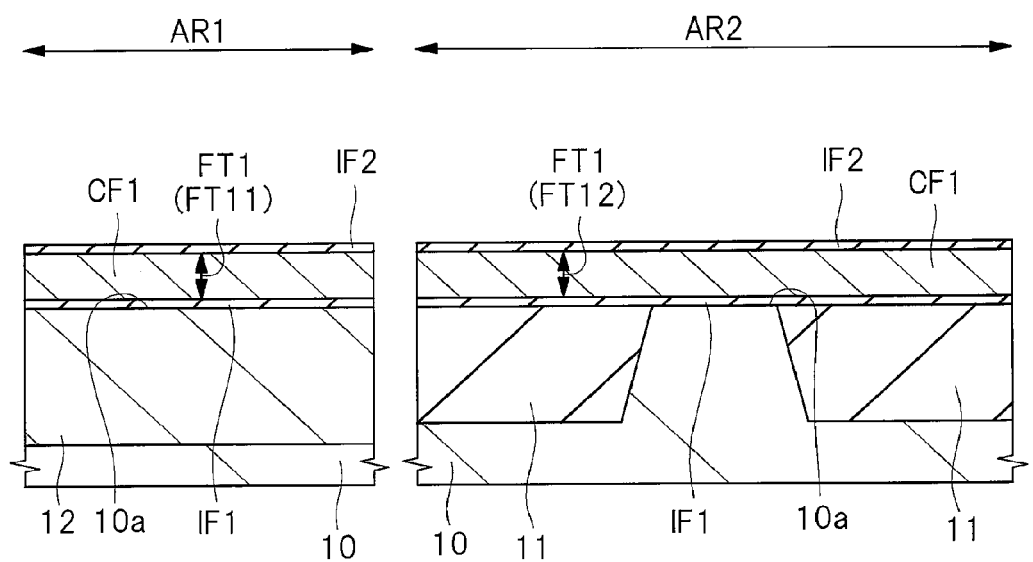
FIG. 5 is a cross-sectional view in the manufacturing process of the semiconductor device according to the first embodiment.

Next, as shown in FIG. 5, the insulating film IF2 is formed on the conductive film CF1 in the memory cell forming region AR1 and the capacitive element forming region AR2. The insulating film IF2 is made of, for example, a silicon oxide film and can be formed by, for example, the thermal oxidation method. However, the insulating film IF2 is not limited to a silicon oxide film and can be changed to various films. For example, a silicon oxynitride film (SiON) may be used as the insulating film IF2.

Next, as shown in FIG. 6, after a resist film PR1 is applied onto the insulating film IF2 in the memory cell forming region AR1 and the capacitive element forming region AR2, the resist film PR1 is patterned by performing the exposure and development process to the resist film PR1. The resist film PR1 is patterned so that the region in which the lower electrode 16 (see FIG. 11) is to be formed in the capacitive element forming region AR2 is covered and the region other than that is exposed.

Next, as shown in FIG. 7, the insulating film IF2 is processed or patterned by the etching using the patterned resist film PR1 as a mask in the memory cell forming region AR1 and the capacitive element forming region AR2. Then, the insulating film IF2 is removed in the memory cell forming region AR1, and the insulator part IP1 including the insulating film IF2 is formed in the region in which the lower electrode 16 (see FIG. 11) is to be formed in the capacitive element forming region AR2. Thereafter, the resist film PR1 is removed.

Figure 8:
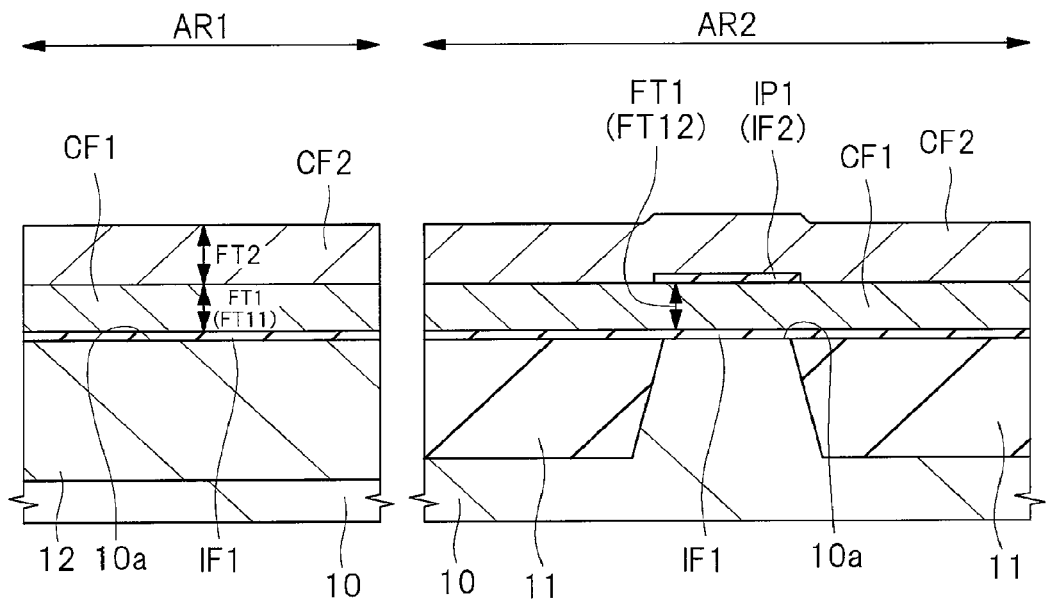
FIG. 8 is a cross-sectional view in the manufacturing process of the semiconductor device according to the first embodiment.

Next, as shown in FIG. 8, the conductive film CF2 made of, for example, a polycrystalline silicon film is formed on the conductive film CF1 and the insulator part IP1 in the memory cell forming region AR1 and the capacitive element forming region AR2. In other words, the conductive film CF2 covering the insulator part IP1 is formed on the conductive film CF1. The conductive film CF2 made of a polycrystalline silicon film can be formed by, for example, the CVD method. Then, by using the photolithography technique and the ion implantation method, an n type impurity such as phosphorus or arsenic is introduced into the conductive film CF2 made of a polycrystalline silicon film. Specifically, the thickness FT2 of the conductive film CF2 can be set to, for example, about 43 to 53 nm.

Figure 9:
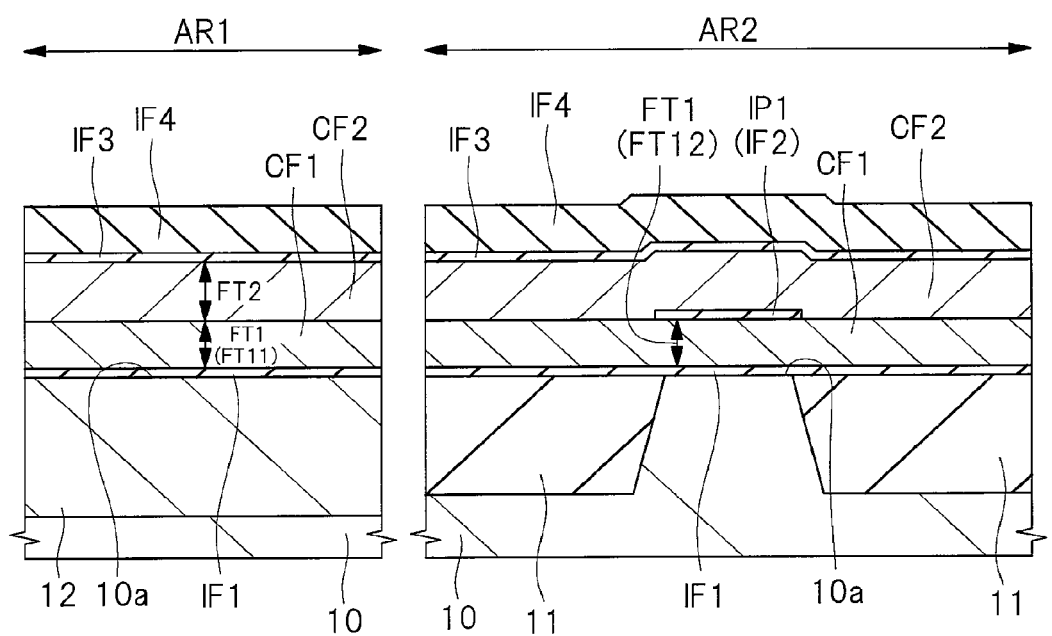
FIG. 9 is a cross-sectional view in the manufacturing process of the semiconductor device according to the first embodiment.

Next, as shown in FIG. 9, an insulating film IF4 containing silicon and nitrogen is formed on the conductive film CF2 in the memory cell forming region AR1 and the capacitive element forming region AR2. For example, the insulating film IF4 made of a silicon nitride film can be formed by the CVD method.

Note that an insulating film IF3 made of a silicon oxide film having a thickness of, for example, about 6 nm may be formed between the conductive film CF2 and the insulating film IF4 by thermally oxidizing the surface of the conductive film CF2 made of a polycrystalline silicon film. The case in which the insulating film IF3 is formed between the conductive film CF2 and the insulating film IF4 will be described below.

Next, as shown in FIG. 10, after a resist film PR2 is applied onto the insulating film IF4 in the memory cell forming region AR1 and the capacitive element forming region AR2, the resist film PR2 is patterned by performing the exposure and development process to the resist film PR2. The resist film PR2 is patterned so that the region in which the control gate electrode 15 (see FIG. 11) is to be formed in the memory cell forming region AR1 is covered and the region other than that is exposed.

Next, as shown in FIG. 11, the insulating film IF4, the conductive films CF2 and CF1 and the insulating film IF1 are processed or patterned by the etching using the patterned resist film PR2 as a mask in the memory cell forming region AR1 and the capacitive element forming region AR2. Then, in the memory cell forming region AR1, the control gate electrode 15 including the conductive films CF1 and CF2, the gate insulating film 13 including the insulating film IF1 between the control gate electrode 15 and the semiconductor substrate 10, and a cap insulating film CP2 including the insulating film IF4 above the control gate electrode 15 are formed. On the other hand, in the capacitive element forming region AR2, the insulating film IF3 and the conductive film CF2 are removed and the conductive film CF1 is patterned with using the insulator part IP1 as a mask, thereby forming the lower electrode 16 including the conductive film CF1. Thereafter, the resist film PR2 is removed. Note that the thickness TH1 of the control gate electrode 15 is equal to the sum of the thickness FT1 of the conductive film CF1 and the thickness FT2 of the conductive film CF2, and the thickness TH2 of the lower electrode 16 is equal to the thickness FT1 of the conductive film CF1.

The control gate electrode 15 is a gate electrode of the selection transistor of the memory cell MC (see FIG. 22 described later). As described above, in the first embodiment, the conductive film CF1 included in the lower electrode 16 of the capacitive element CD1 (see FIG. 18 described later) is formed in the same process as that of forming the conductive film CF1 included in the control gate electrode 15 of the memory cell MC (see FIG. 22 described later). In addition, the lower electrode 16 includes the conductive film CF1 formed in the same layer as the conductive film CF1 included in the control gate electrode 15.

The case in which the control gate electrode 15 includes the two layers of conductive films CF1 and CF2 as described above will be considered. In such a case, the thickness of each of the conductive films CF1 and CF2 becomes smaller in comparison with the case in which the control gate electrode 15 includes only one layer of a conductive film. Therefore, since the degree of freedom of the growth of crystal grains in the polycrystalline silicon film is reduced, the growth of crystal grains can be suppressed even when exposed to high temperature of nitriding treatment or the like, and the crystal grain diameter (grain size) can be reduced.

When the insulating film IF3 is formed between the conductive film CF2 and the insulating film IF4 in the memory cell forming region AR1, a cap insulating film CP1 as an insulator part including the insulating film IF3 between the control gate electrode 15 and the cap insulating film CP2 is formed. Also, when the insulating film IF3 is formed between the conductive film CF2 and the insulating film IF4 in the capacitive element forming region AR2, the insulating film IF3 is removed.

Figure 12:
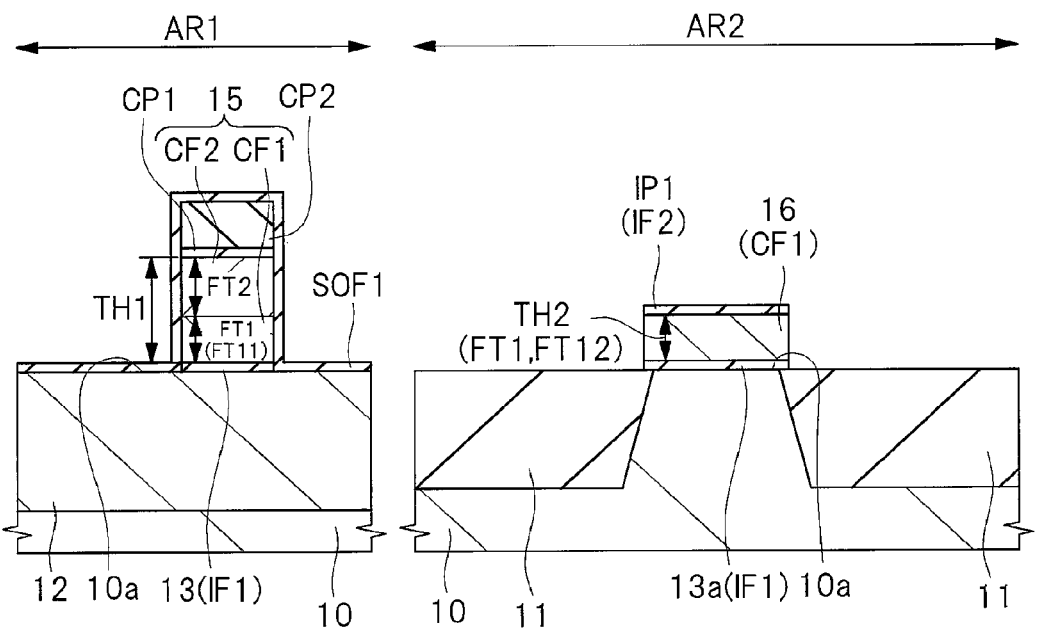
FIG. 12 is a cross-sectional view in the manufacturing process of the semiconductor device according to the first embodiment.

Next, as shown in FIG. 12, in the memory cell forming region AR1, the upper surface 10a of the semiconductor substrate 10 and the side surface of the control gate electrode 15 are oxidized to form a sacrificial oxide film SOF1. The sacrificial oxide film SOF1 can be formed by, for example, the thermal oxidation method or the ISSG (In-Situ Steam Generation) oxidation method or by using the thermal oxidation method and the ISSG oxidation method in combination.

Next, an n type impurity such as phosphorus (P) or arsenic (As) is introduced by the ion implantation method into the p type well 12 with using the cap insulating film CP2 and the control gate electrode 15 having the sacrificial oxide film SOF1 formed on the side surface thereof as a mask. Consequently, an n⁻ type semiconductor region (not shown) is formed in an upper layer part of the p type well 12 located on a side of the control gate electrode 15 in which the memory gate electrode 26 (see FIG. 18 described later) is to be disposed. The n⁻ type semiconductor region (not shown) is provided for adjusting the threshold voltage of the memory transistor and is formed so as to be in contact with the low concentration impurity diffusion region 28 (see FIG. 20 described later) formed on a side opposite to the control gate electrode 15 with the memory gate electrode 26 interposed therebetween. Also, the concentration of then type impurity in the n⁻ type semiconductor region (not shown) is lower than the concentration of the n type impurity in the low concentration impurity diffusion region 28.

When the sacrificial oxide film SOF1 is formed on the upper surface of the p type well 12, it is possible to prevent the upper surface of the p type well 12 from being damaged when introducing an n type impurity into the p type well 12 by the ion implantation method.

Note that, when the sacrificial oxide film SOF1 is formed in the memory cell forming region AR1, the sacrificial oxide film SOF1 may be formed on the side surface of the lower electrode 16 also in the capacitive element forming region AR2, but the illustration thereof is omitted here.

Figure 13:
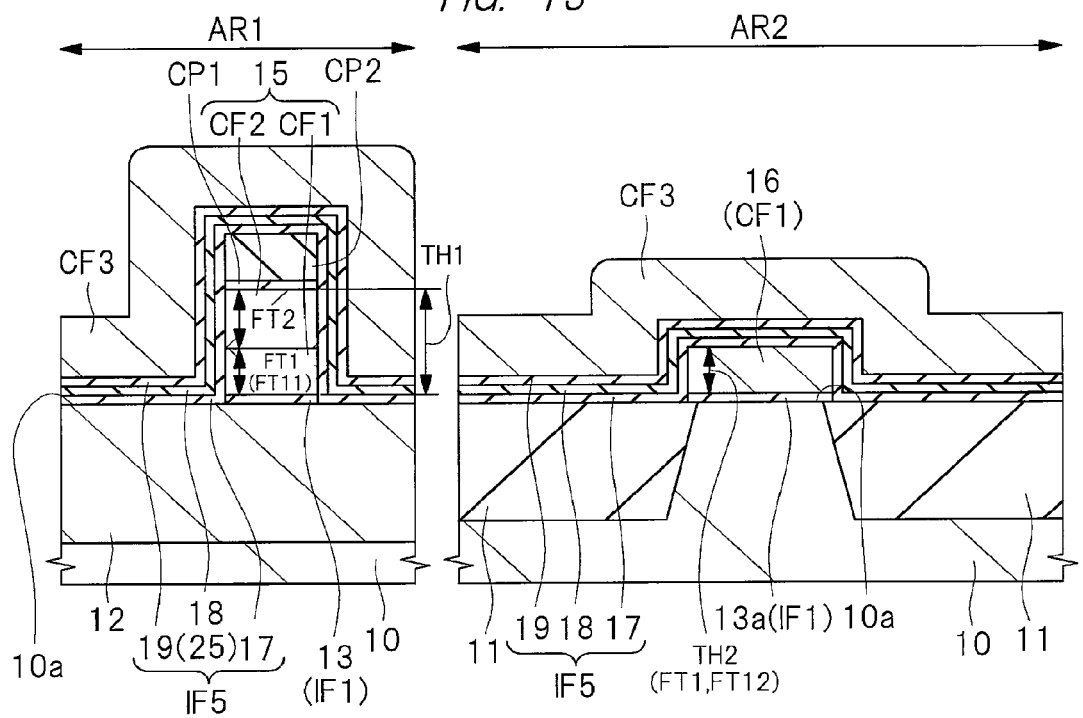
FIG. 13 is a cross-sectional view in the manufacturing process of the semiconductor device according to the first embodiment.

Next, as shown in FIG. 13, the insulating film IF5 is formed on the semiconductor substrate 10 including the surface of the control gate electrode 15 and the surface of the lower electrode 16 in the memory cell forming region AR1 and the capacitive element forming region AR2. In other words, the insulating film IF5 which covers the control gate electrode 15 and the lower electrode 16 and has a charge accumulating part therein is formed. The insulating film IF5 is composed of, for example, the silicon oxide film 17, the silicon nitride film 18 on the silicon oxide film 17 and the silicon oxide film 19 on the silicon nitride film 18, and it is a so-called ONO film. The insulating film IF5 can be formed by, for example, the CVD method. Also, the thickness of the silicon oxide film 17 is, for example, 5 nm, the thickness of the silicon nitride film 18 is, for example, 10 nm and the thickness of the silicon oxide film 19 is, for example, 5 nm.

The silicon nitride film 18 in the insulating film IF5 serves as the charge accumulating film 25 of the memory transistor in the memory cell forming region AR1. In the first embodiment, the silicon nitride film 18 is used as the charge accumulating film 25, but other insulating films having a trap level may be used as the charge accumulating film 25. For example, an aluminum oxide film (alumina film) can be used as the charge accumulating film 25.

Note that the sacrificial oxide film SOF1 and the insulator part IP1 may be removed as shown in FIG. 13 before the insulating film IF5 is formed, but it is not always necessary to remove the sacrificial oxide film SOF1 and the insulator part IP1.

Next, as shown in FIG. 13, the conductive film CF3 made of, for example, a polycrystalline silicon film is formed on the insulating film IF5 in the memory cell forming region AR1 and the capacitive element forming region AR2. The conductive film CF3 made of a polycrystalline silicon film can be formed by, for example, the CVD method.

Figure 14:
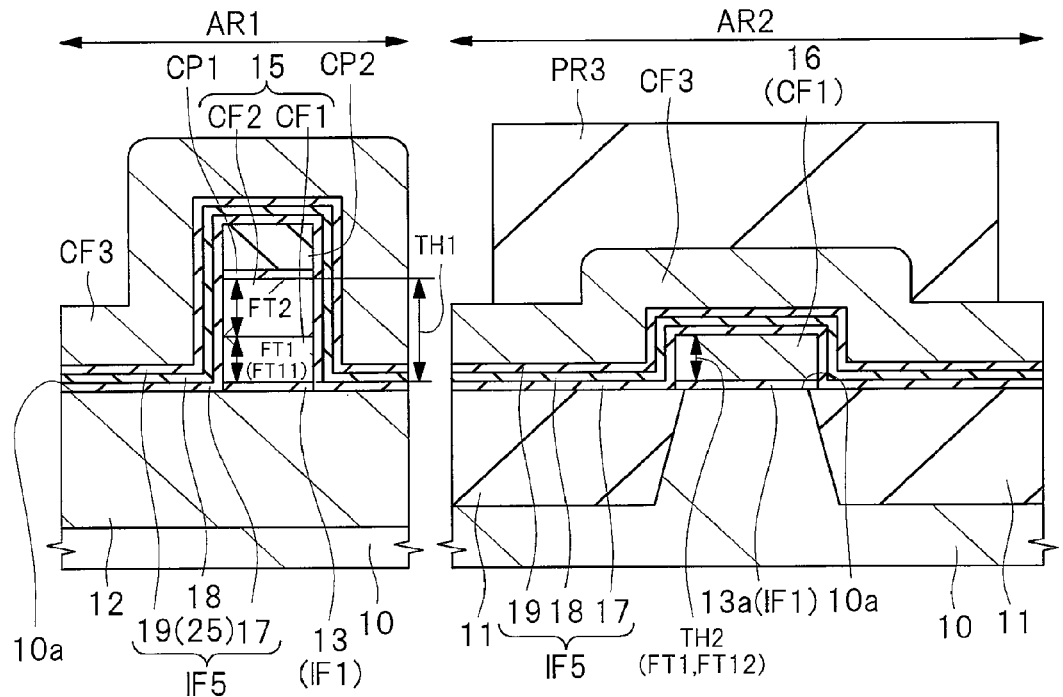
FIG. 14 is a cross-sectional view in the manufacturing process of the semiconductor device according to the first embodiment.

Next, as shown in FIG. 14, after a resist film PR3 is applied onto the conductive film CF3 in the memory cell forming region AR1 and the capacitive element forming region AR2, the resist film PR3 is patterned by performing the exposure and development process to the resist film PR3. The resist film PR3 is patterned so that the region in which the upper electrode 23 (see FIG. 15 described later) is to be formed in the capacitive element forming region AR2 is covered and the region other than that is exposed.

Figure 15:
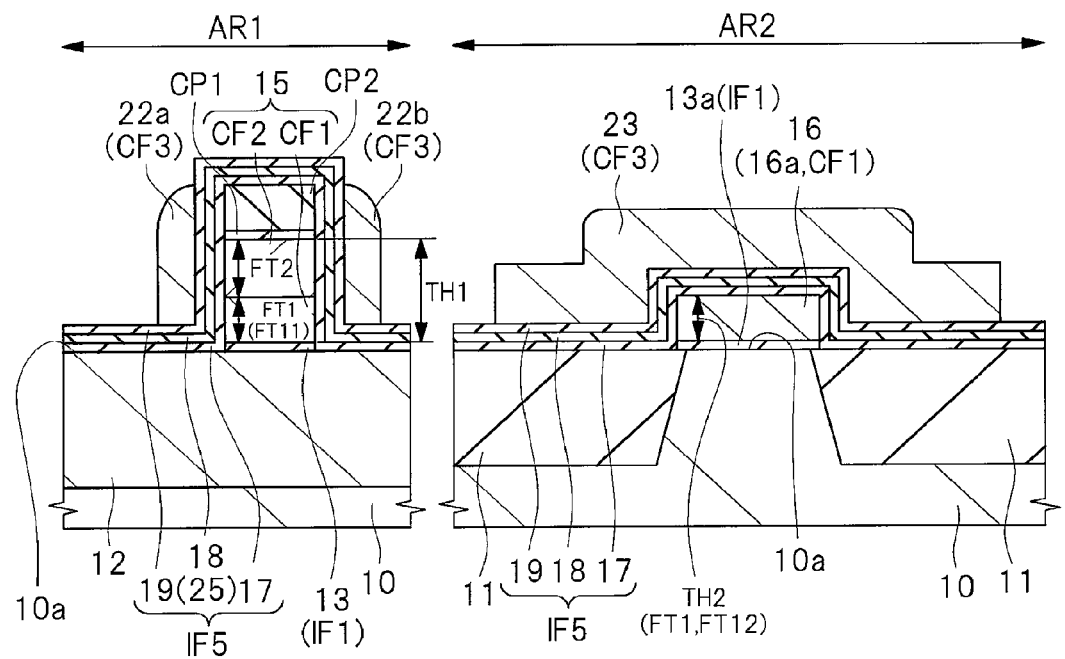
FIG. 15 is a cross-sectional view in the manufacturing process of the semiconductor device according to the first embodiment.

Next, as shown in FIG. 15, the conductive film CF3 made of, for example, a polycrystalline silicon film is etched back by the anisotropic etching in the memory cell forming region AR1 and the capacitive element forming region AR2. Consequently, a sidewall 22a and a sidewall 22b including the conductive film CF3 are left on both side walls or side surfaces of the control gate electrode 15 via the insulating film IF5 in the memory cell forming region AR1.

On the other hand, in the capacitive element forming region AR2, the upper electrode 23 including the conductive film CF3 is formed above the lower electrode 16 including the conductive film CF1 via the insulating film IF5.

In addition, as shown in FIG. 16, a sidewall 22c including the conductive film CF3 is left on a peripheral side surface of the lower electrode 16 including the conductive film CF1 via the insulating film IF5 in the capacitive element forming region AR2.

Next, as shown in FIG. 17, after a resist film (not shown) is applied onto the semiconductor substrate 10 in the memory cell forming region AR1 and the capacitive element forming region AR2, the resist film (not shown) is patterned by performing the exposure and development process to the resist film (not shown). The resist film is patterned so that the capacitive element forming region AR2 is completely covered and a part of the memory cell forming region AR1 is opened. Specifically, the resist film is patterned so as to expose the sidewall 22b (see FIG. 15) formed on the side wall or side surface on one side of the control gate electrode 15 in the memory cell forming region AR1.

Next, the sidewall 22b (see FIG. 15) exposed on the right side wall of the control gate electrode 15 is removed by the etching using the patterned resist mask (not shown) as a mask in the memory cell forming region AR1. At this time, the sidewall 22a formed on the left side wall of the control gate electrode 15 is covered with the resist film (not shown), and is thus left without being removed. The sidewall 22a is apart to be the memory gate electrode 26 (see FIG. 18 described later).

On the other hand, the sidewall 22c (see FIG. 16) exposed on the peripheral side surface of the lower electrode 16 is removed in the capacitive element forming region AR2. At this time, the upper electrode 23 is protected by the resist film (not shown), and is thus left without being removed. Thereafter, the patterned resist film (not shown) is removed.

Next, as shown in FIG. 18, a part of the insulating film IF5 which is not covered with any of the upper electrode 23 and the memory gate electrode 26 is etched and removed in the memory cell forming region AR1 and the capacitive element forming region AR2. At this time, in the memory cell forming region AR1, a part of the insulating film IF5 between the control gate electrode 15 and the memory gate electrode 26 and a part of the insulating film IF5 between the memory gate electrode 26 and the semiconductor substrate 10 are left, and the other parts of the insulating film IF5 are removed. In addition, in the capacitive element forming region AR2, a part of the insulating film IF5 between the lower electrode 16 and the upper electrode 23 and a part of the insulating film IF5 between the upper electrode 23 and the semiconductor substrate 10 are left, and the other parts of the insulating film IF5 are removed.

In this manner, in the memory cell forming region AR1, the sidewall 22a including the conductive film CF3 is left only on the left side wall or side surface of the control gate electrode 15 via the insulating film IF5, so that the memory gate electrode 26 with a sidewall shape is formed. Also, the part of the insulating film IF5 between the control gate electrode 15 and the memory gate electrode 26 and the part of the insulating film IF5 between the memory gate electrode 26 and the semiconductor substrate 10 are left, and the insulating film 27 serving as a gate insulating film including the remaining insulating film IF5 is formed. At this time, the silicon nitride film 18 constituting the insulating film 27 serves as the charge accumulating film 25.

On the other hand, in the capacitive element forming region AR2, the part of the insulating film IF5 between the lower electrode 16 and the upper electrode 23 and the part of the insulating film IF5 between the upper electrode 23 and the semiconductor substrate 10 are left, and the capacitive insulating film 27a including the remaining insulating film IF5 is formed. The capacitive insulating film 27a is composed of the silicon oxide film 17, the silicon nitride film 18 and the silicon oxide film 19. Thus, the capacitive element CD1 is formed of the lower electrode 16, the upper electrode 23 and the capacitive insulating film 27a. Note that the insulating film IF5 exposed on the peripheral side surface of the lower electrode 16 is also removed as shown in FIG. 19.

Meanwhile, the capacitive element CD2 having the semiconductor substrate 10 as the lower electrode 10b and the lower electrode 16 formed on the semiconductor substrate 10 via the insulating film IF1 as the upper electrode 16a is formed. At this time, the insulator part 13a including the insulating film IF1 serves as the capacitive insulating film of the capacitive element CD2. Thus, the capacitive element CD2 is formed of the lower electrode 10b, the upper electrode 16a and the insulator part 13a. Specifically, in the capacitive element forming region AR2, the insulating film IF1 is formed on the semiconductor substrate 10 when forming the insulating film IF1, and the insulator part 13a including the insulating film IF1 between the upper electrode 16a and the semiconductor substrate 10 is formed when patterning the conductive film CF1.

Figure 20:
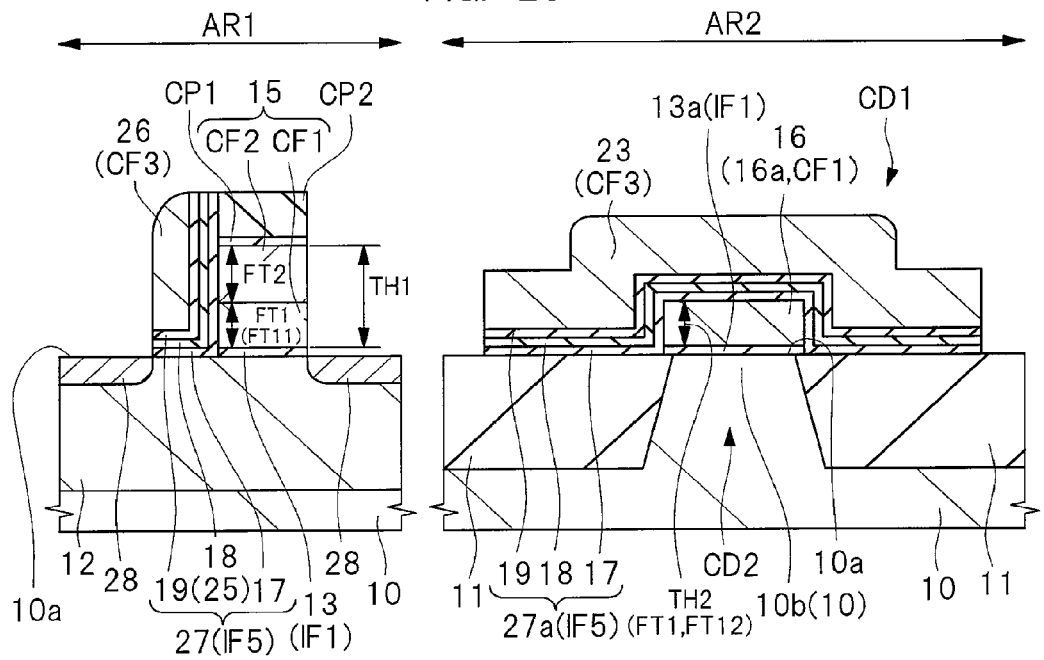
FIG. 20 is a cross-sectional view in the manufacturing process of the semiconductor device according to the first embodiment.

Next, as shown in FIG. 20, the shallow low concentration impurity diffusion regions 28 in alignment with the control gate electrode 15 and the memory gate electrode 26 are formed by using the photolithography technique and the ion implantation method in the memory cell forming region AR1. The shallow low concentration impurity diffusion region 28 is an n type semiconductor region to which an n type impurity such as phosphorus or arsenic is introduced.

Figure 21:
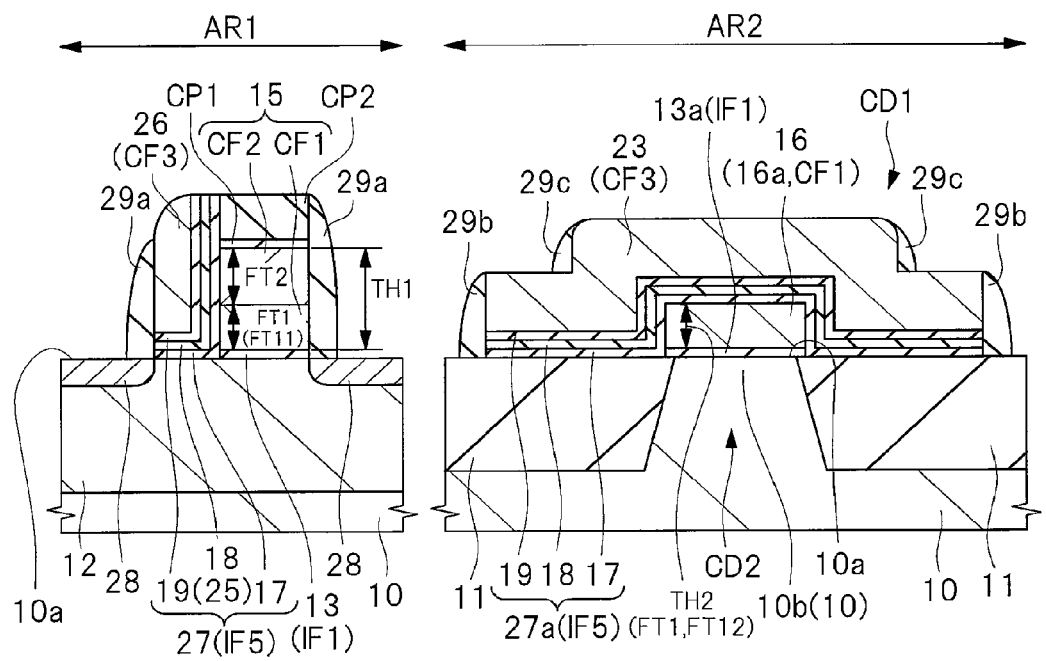
FIG. 21 is a cross-sectional view in the manufacturing process of the semiconductor device according to the first embodiment.

Subsequently, as shown in FIG. 21, an insulating film made of a silicon oxide film is formed on the semiconductor substrate 10. The insulating film made of a silicon oxide film can be formed by, the CVD method. Then, the sidewalls 29a and 29b are formed by anisotropically etching the insulating film. In the memory cell forming region AR1, the sidewall 29a made of the insulating film is formed on the right side wall or side surface of the control gate electrode 15 and on the left side wall or side surface of the memory gate electrode 26. On the other hand, in the capacitive element forming region AR2, the sidewall 29b made of the insulating film is formed on the side wall or side surface of the upper electrode 23. The insulating film constituting the sidewalls 29a and 29b is formed of a single film of a silicon oxide film, but is not limited to this. For example, the insulating film may be formed of a laminated film of a silicon nitride film and a silicon oxide film. Note that the sidewall 29c made of an insulating film such as a silicon oxide film is formed on the side wall or side surface of the lower electrode 16 via the capacitive insulating film 27a and the upper electrode 23. In other words, in the stepped-part region at the boundary between the overlapping region and the non-overlapping region of the upper electrode 23, the sidewall 29c is formed so as to cover the upper electrode 23.

Figure 22:
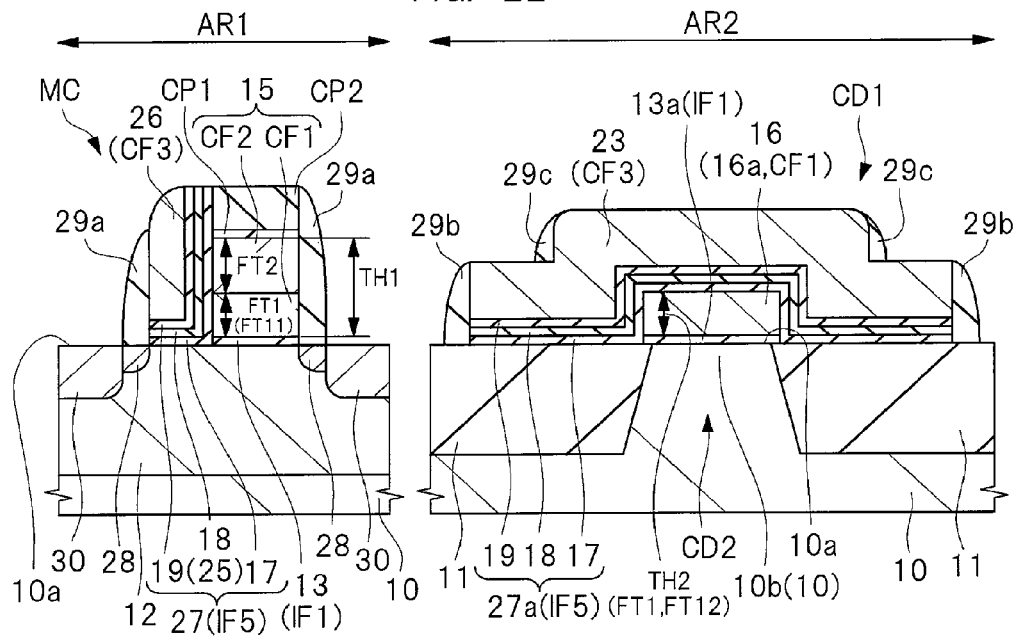
FIG. 22 is a cross-sectional view in the manufacturing process of the semiconductor device according to the first embodiment.

Next, as shown in FIG. 22, the deep high concentration impurity diffusion regions 30 in alignment with the sidewalls 29a are formed by using the photolithography technique and the ion implantation method in the memory cell forming region AR1. The deep high concentration impurity diffusion region 30 is an n type semiconductor region to which an n type impurity such as phosphorus or arsenic is introduced. The source region and the drain region of the memory cell are formed of the deep high concentration impurity diffusion regions 30 and the shallow low concentration impurity diffusion regions 28. By forming the source region and the drain region from the shallow low concentration impurity diffusion regions 28 and the deep high concentration impurity diffusion regions 30 in this manner, the source region and the drain region can have the LDD structure. After forming the high concentration impurity diffusion regions 30 as described above, the heat treatment at about 1000° C. is performed. Consequently, the introduced impurity is activated. Thus, the memory cell MC composed of the control gate electrode 15, the gate insulating film 13, the memory gate electrode 26 and the insulating film 27 is formed.

Figure 23:
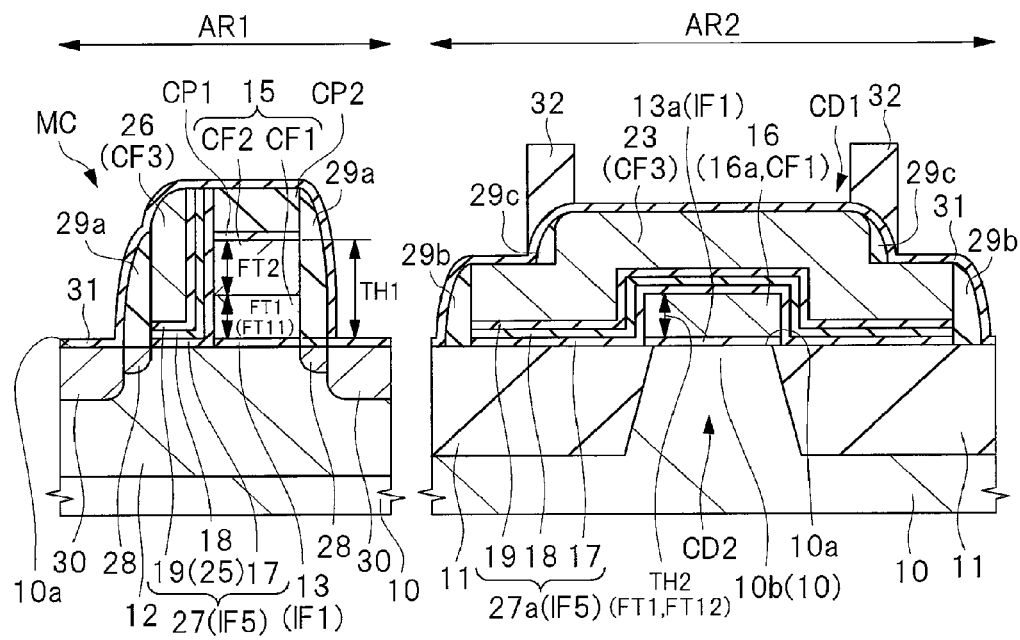
FIG. 23 is a cross-sectional view in the manufacturing process of the semiconductor device according to the first embodiment.
Figure 24:
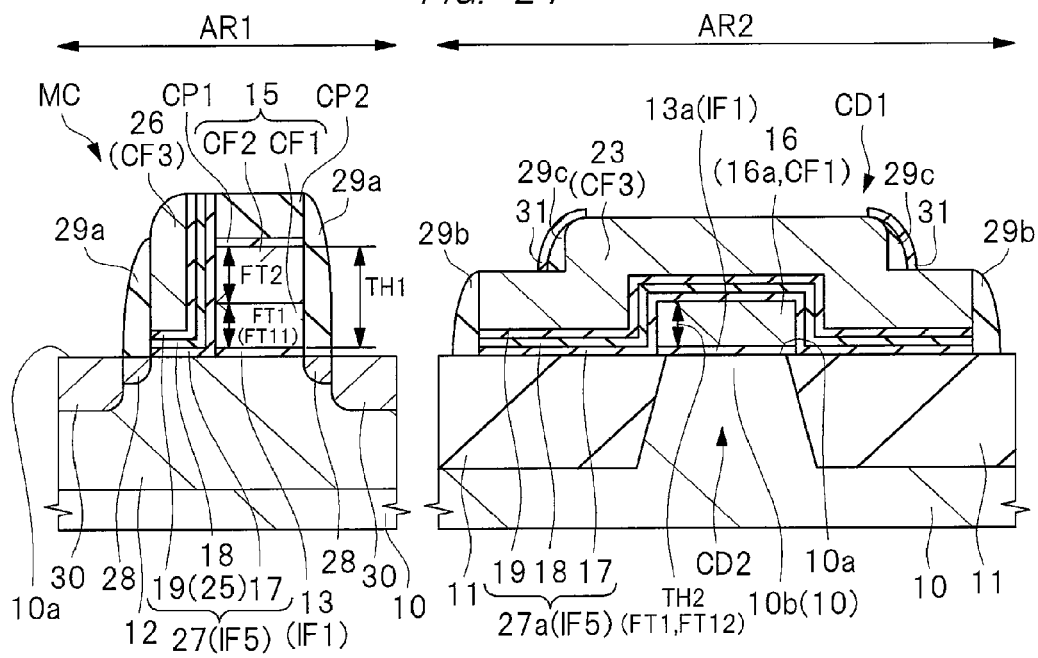
FIG. 24 is a cross-sectional view in the manufacturing process of the semiconductor device according to the first embodiment.
Figure 25:
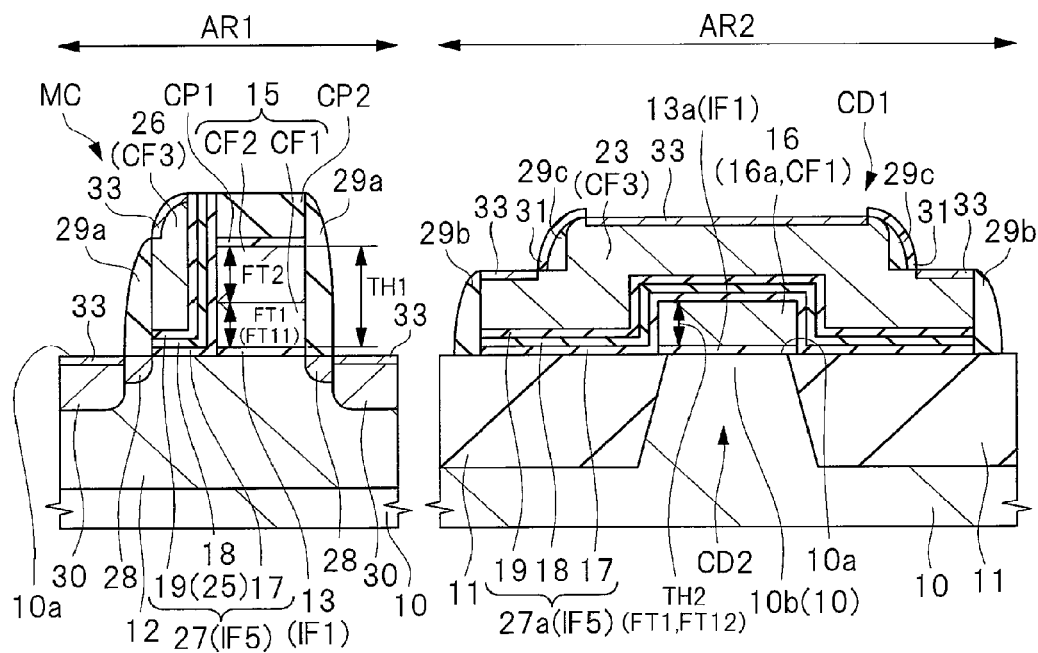
FIG. 25 is a cross-sectional view in the manufacturing process of the semiconductor device according to the first embodiment.

Next, as shown in FIGS. 23 to 25, the metal silicide film 33 is formed on the surfaces of the control gate electrode 15, the memory gate electrode 26, the lower electrode 16, the upper electrode 23 and the high concentration impurity diffusion regions 30 as the source and drain regions.

First, as shown in FIG. 23, the silicon oxide film 31 is formed on the semiconductor substrate 10 in the memory cell forming region AR1 and the capacitive element forming region AR2. Then, after a resist film 32 is applied onto the silicon oxide film 31, the resist film 32 is patterned by performing the exposure and development process. The resist film 32 is patterned so that a part of the resist film 32 which covers the upper electrode 23 via the sidewall 29c is left in the stepped-part region at the boundary between the overlapping region and the non-overlapping region of the upper electrode 23 in the capacitive element forming region AR2.

Subsequently, as shown in FIG. 24, the silicon oxide film 31 is patterned by performing the etching using the resist film 32 as a mask. In this manner, the silicon oxide film 31 is formed so as to cover the upper electrode 23 via the sidewall 29c in the stepped-part region at the boundary between the overlapping region and the non-overlapping region of the upper electrode 23 in the capacitive element forming region AR2.

Subsequently, in the memory cell forming region AR1 and the capacitive element forming region AR2, a metal film made of, for example, a cobalt film is formed on the semiconductor substrate 10. At this time, in the memory cell forming region AR1, the metal film is formed so as to be in direct contact with the exposed memory gate electrode 26. Similarly, the metal film is in direct contact with the high concentration impurity diffusion region 30. Meanwhile, in the capacitive element forming region AR2, the metal film is in direct contact with a part of the upper electrode 23. The metal film made of a cobalt film can be formed by, for example, the sputtering method. The thickness of the metal film is, for example, 10 nm.

Then, the first heat treatment is performed to the semiconductor substrate 10. Thereafter, the surface of the semiconductor substrate 10 is cleaned. This cleaning is performed by APM (Ammonium hydroxide hydrogen Peroxide Mixture) cleaning or HPM cleaning. The APM cleaning uses a mixture solution containing ammonium hydroxide ($NH_4OH$)/hydrogen peroxide ($H_2O_2$)/pure water ($H_2O$) and has a good removal effect for particles and organic substances. On the other hand, the HPM cleaning uses a mixture solution containing hydrochloric acid (HCl)/hydrogen peroxide ($H_2O_2$)/pure water ($H_2O$) and has a good removal effect for metals. Subsequently, the second heat treatment is performed.

Consequently, as shown in FIG. 25, in the memory cell forming region AR1, the conductive film CF3 made of a polycrystalline silicon film and the metal film made of a cobalt film are reacted to form the metal silicide film 33 made of a cobalt silicide film on the surface of the memory gate electrode 26. The metal silicide film 33 made of a cobalt silicide film is formed for reducing the resistance of the memory gate electrode 26. Though not shown, the metal silicide film 33 may be formed on a part of the surface of the control gate electrode 15 from which the cap insulating films CP2 and CP1 have been removed.

Similarly, by the heat treatment described above, the high concentration impurity diffusion region 30 made of silicon and the metal film made of a cobalt film are reacted to form the metal silicide film 33 made of a cobalt silicide film also on the surface of the high concentration impurity diffusion region 30. Therefore, the reduction in resistance can be achieved also in the high concentration impurity diffusion region 30.

On the other hand, in the capacitive element forming region AR2, the conductive film CF3 made of a polycrystalline silicon film and the metal film made of a cobalt film are reacted to form the metal silicide film 33 made of a cobalt silicide film on a part of the surface of the upper electrode 23 exposed from the silicon oxide film 31. The metal silicide film 33 made of a cobalt silicide film is formed for reducing the resistance of the upper electrode 23. Though not shown, the metal silicide film 33 may be formed on the surface of the lower electrode 16.

Then, the unreacted metal film is removed from the surface of the semiconductor substrate 10. Note that the case where a cobalt silicide film is formed as the metal silicide film 33 is described in the first embodiment, but a nickel silicide film, a titanium silicide film or the like may be formed as the metal silicide film 33 instead of a cobalt silicide film.

In the manner described above, the memory cell MC can be formed in the memory cell forming region AR1 and the capacitive element CD1 according to the first embodiment can be formed in the capacitive element forming region AR2.

Next, the wiring process will be described with reference to FIG. 3. As shown in FIG. 3, the interlayer insulating film 34 is formed on the upper surface 10a of the semiconductor substrate 10. The interlayer insulating film 34 is made of, for example, a silicon oxide film and can be formed by the CVD using TEOS (Tetra Ethyl Ortho Silicate) as a raw material. Thereafter, the surface of the interlayer insulating film 34 is planarized by, for example, the CMP method.

Subsequently, the contact holes CH1 and CH2 are formed in the interlayer insulating film 34 by using the photolithography technique and the etching technique. At this time, the contact hole CH1 penetrating through the interlayer insulating film 34 to reach the source region or the drain region is formed in the memory cell forming region AR1. Also, the contact hole CH2 is formed in the capacitive element forming region AR2. The contact hole CH2 penetrates through the interlayer insulating film 34 to reach the upper electrode 23. Though not shown, a contact hole penetrating through the interlayer insulating film 34 to reach the lower electrode 16 may be formed.

Then, a titanium/titanium nitride film is formed on the interlayer insulating film 34 including bottom surfaces and inner surfaces of the contact holes CH1 and CH2. The titanium/titanium nitride film is composed of a laminated film of a titanium film and a titanium nitride film, and can be formed by, for example, the sputtering method. The titanium/titanium nitride film has so-called barrier properties for preventing the diffusion of tungsten, which is a material of the film embedded in the following process, into silicon.

Subsequently, a tungsten film serving as a conductive film is formed on the entire upper surface 10a of the semiconductor substrate 10 so as to fill the contact holes CH1 and CH2. The tungsten film can be formed by, for example, the CVD method. Then, the unnecessary titanium/titanium nitride film and tungsten film formed on the interlayer insulating film 34 are removed by, for example, the CMP method, thereby forming the plugs PG1, PG2 (see FIG. 2) and PG3.

Among these, the plug PG1 is formed in the memory cell forming region AR1. The plug PG1 thus formed is made of the conductive film embedded in the contact hole CH1 and is electrically connected to the high concentration impurity diffusion region 30 formed in the source region or the drain region.

Also, the plugs PG2 (see FIG. 2) and PG3 are formed in the capacitive element forming region AR2. The plug PG2 thus formed is made of the conductive film embedded in the contact hole (not shown) and is electrically connected to the lower electrode 16. In addition, the plug PG3 thus formed is made of the conductive film embedded in the contact hole CH2 and is electrically connected to the upper electrode 23.

Next, a titanium/titanium nitride film, an aluminum film containing copper and a titanium/titanium nitride film are sequentially formed on the interlayer insulating film 34 and the plugs PG1, PG2 (see FIG. 2) and PG3. These films can be formed by, for example, the sputtering method. Subsequently, these films are patterned by using the photolithography technique and the etching technique, thereby forming the wirings HL1, HL2 (see FIG. 2) and HL3. The wiring HL1 is electrically connected to the plug PG1, the wiring HL2 is electrically connected to the plug PG2 and the wiring HL3 is electrically connected to the plug PG3. Also, the insulating film 35 is formed on the interlayer insulating film 34 between the adjacent wirings HL1 and between the adjacent wirings HL3. Wirings are further formed in the upper layers of the wirings, but the descriptions thereof are omitted here. In this manner, the semiconductor device according to the first embodiment is finally formed.

<Semiconductor Device of Comparative Example>

Figure 26:
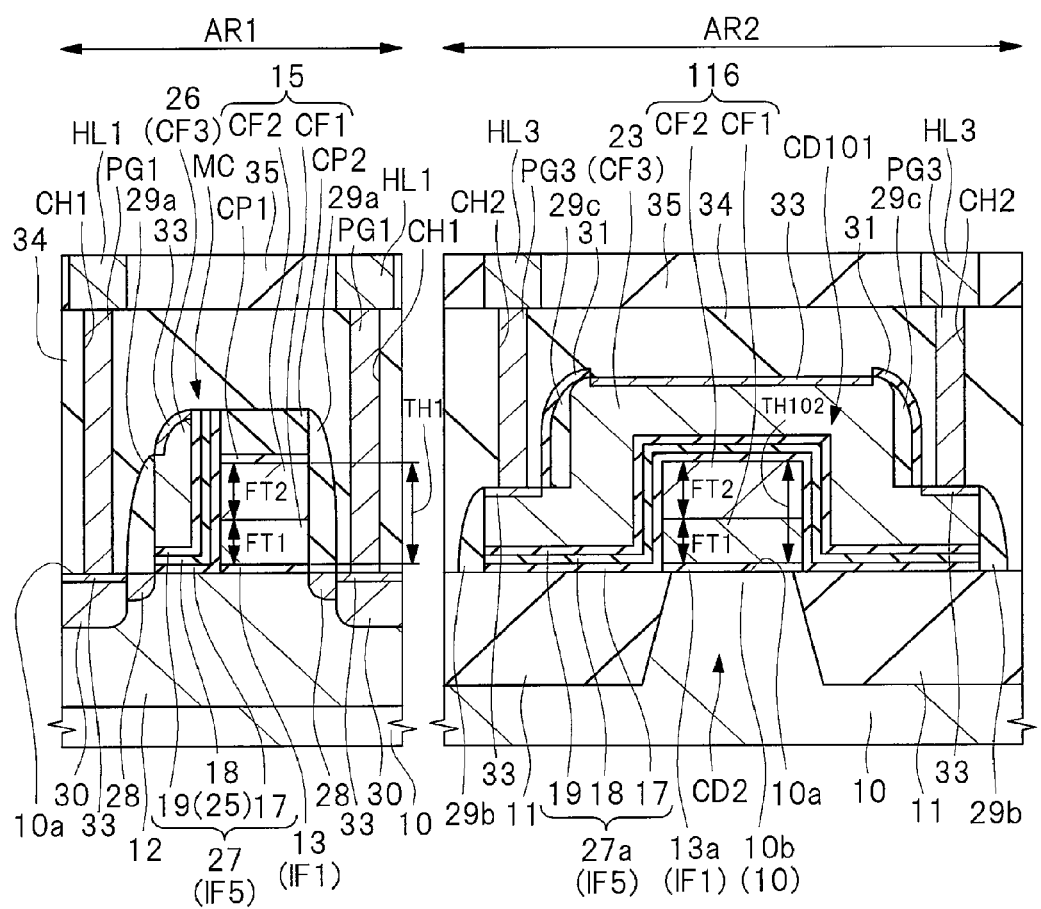
FIG. 26 is a cross-sectional view of a capacitive element and a memory cell in a semiconductor device according to a comparative example.

Next, a semiconductor device of a comparative example will be described. FIG. 26 is a cross-sectional view showing a capacitive element and a memory cell in the semiconductor device of the comparative example.

As shown in FIG. 26, the semiconductor device of the comparative example is the same as the semiconductor device according to the first embodiment except that a lower electrode 116 included in a capacitive element CD101 includes the conductive film CF1 and the conductive film CF2 formed on the conductive film CF1.

In the semiconductor device of the comparative example, the conductive film CF1 included in the lower electrode 116 is formed in the same layer as the conductive film CF1 included in the control gate electrode 15, and the conductive film CF2 included in the lower electrode 116 is formed in the same layer as the conductive film CF2 included in the control gate electrode 15. In other words, in the comparative example, the conductive film CF1 included in the lower electrode 116 is formed in the same process as that of forming the conductive film CF1 included in the control gate electrode 15, and the conductive film CF2 included in the lower electrode 116 is formed in the same process as that of forming the conductive film CF2 included in the control gate electrode 15.

Therefore, in the semiconductor device of the comparative example, a thickness TH102 of the lower electrode 116 including the conductive film CF1 and the conductive film CF2 is equal to the thickness TH1 of the control gate electrode 15 including the conductive film CF1 and the conductive film CF2. In such a case, the height position of the upper surface of the lower electrode 116 is almost equal to the height position of the upper surface of the control gate electrode 15. Therefore, depending on the relationship of the thicknesses of the cap insulating films CP1 and CP2 and the thickness of the upper electrode 23, the height position of the upper surface of the upper electrode 23, that is, the height position of the upper surface of the capacitive element CD101 becomes higher than the height position of the upper surface of the cap insulating film CP2, that is, the height position of the upper surface of the memory cell MC.

When the height position of the upper surface of the capacitive element CD101 is higher than the height position of the upper surface of the memory cell MC, since the upper surface of the interlayer insulating film 34 needs to be sufficiently separated upward from the upper surface of the capacitive element CD101, the interlayer insulating film 34 needs to have a sufficiently large thickness in comparison with the case in which the height position of the upper surface of the capacitive element CD101 is lower than the height position of the upper surface of the memory cell MC.

Thus, due to the increase in thickness of the interlayer insulating film 34, the positional accuracy of the bottom portion of the contact hole CH2 is degraded when forming the contact hole CH2 and the electric conduction may not be established between the plug PG3 and the upper electrode 23, so that the performance of the semiconductor device is deteriorated.

Meanwhile, if the thickness of the interlayer insulating film 34 is not sufficiently increased, there is the fear that the upper surface of the upper electrode 23 is exposed when planarizing the interlayer insulating film 34 and the electric conduction is established between the wiring formed above the capacitive element CD101 and the upper electrode 23 to cause the short-circuit, so that the performance of the semiconductor device is deteriorated. Accordingly, it is desired that the wiring is not disposed on the part of the interlayer insulating film 34 which is overlapped with the capacitive element CD101 when seen in a plan view and the wiring is disposed on the part of the interlayer insulating film 34 which is not overlapped with the capacitive element CD101 when seen in a plan view. However, this may increase the area of the semiconductor chip CHP as the semiconductor device.

<Main Characteristics and Effects of Present Embodiment>

On the other hand, in the semiconductor device according to the first embodiment, the conductive film CF1 included in the lower electrode 16 is formed in the same layer as the conductive film CF1 included in the control gate electrode 15, but the lower electrode 16 does not include the conductive film formed in the same layer as the conductive film CF2 included in the control gate electrode 15. In other words, in the first embodiment, the conductive film CF1 included in the lower electrode 16 is formed in the same process as that of forming the conductive film CF1 included in the control gate electrode 15, but the lower electrode 16 does not include the conductive film formed in the same process as that of forming the conductive film CF2 included in the control gate electrode 15.

Accordingly, in the semiconductor device according to the first embodiment, the thickness TH2 of the lower electrode 16 which includes the conductive film CF1 but does not include the conductive film CF2 is smaller than the thickness TH1 of the control gate electrode 15 including the conductive film CF1 and the conductive film CF2. In such a case, the height position of the upper surface of the lower electrode 16 is lower than the height position of the upper surface of the control gate electrode 15. Therefore, the height position of the upper surface of the upper electrode 23, that is, the height position of the upper surface of the capacitive element CD1 can be made lower than the height position of the upper surface of the cap insulating film CP2, that is, the height position of the upper surface of the memory cell MC.

The thickness of the insulating film IF1 (sum of the thickness of the insulating film IF1 and the thickness of the element isolation region 11 interposed between the lower surface of the insulating film IF1 and the upper surface of the semiconductor substrate 10 (not shown)) is set to, for example, about 41 to 51 nm, the thickness TH2 of the conductive film CF1, that is, the lower electrode 16 is set to, for example, about 36 to 44 nm, the thickness of the insulating film IF5 is set to, for example, about 18 to 22 nm, and the thickness of the conductive film CF3, that is, the upper electrode 23 is set to, for example, about 52 to 64 nm. Meanwhile, the thickness FT2 of the conductive film CF2 is set to, for example, about 43 to 53 nm. In such a case, in the first embodiment, the height from the upper surface 10a of the semiconductor substrate 10 to the upper surface of the upper electrode 23 is, for example, about 147 to 181 nm by adding up the thicknesses of each of the insulating film IF1, the conductive film CF1, the insulating film IF5 and the conductive film CF3. On the other hand, in the comparative example, the height from the upper surface 10a of the semiconductor substrate 10 to the upper surface of the upper electrode 23 is, for example, about 190 to 234 nm in the same manner. Therefore, in the semiconductor device according to the first embodiment, the height of the upper surface of the upper electrode 23 can be lowered by the thickness FT2 of the conductive film CF2, that is, about 43 to 53 nm in comparison with the semiconductor device of the comparative example.

In the first embodiment, even when the thickness of the interlayer insulating film 34 is reduced in comparison with the comparative example, the upper surface of the interlayer insulating film 34 can be sufficiently separated upward from the upper surface of the conductive element CD1. Also, in the first embodiment, since the thickness of the interlayer insulating film 34 can be reduced in comparison with the comparative example, the positional accuracy of the bottom portion of the contact hole CH2 can be improved when forming the contact hole CH2 and the electric conduction between the plug PG3 and the upper electrode 23 can be reliably established, so that the performance of the semiconductor device can be improved.

In addition, in the first embodiment, even when the thickness of the interlayer insulating film 34 is reduced in comparison with the comparative example, it is possible to prevent the upper surface of the upper electrode 23 from being exposed when planarizing the interlayer insulating film 34 and possible to prevent the occurrence of the short-circuit due to the electric conduction between the wiring formed above the capacitive element and the upper electrode 23, so that the performance of the semiconductor device can be improved. Therefore, it is possible to dispose the wiring also on a part of the interlayer insulating film 34 overlapped with the capacitive element CD1 when seen in a plan view, and thus the area of the semiconductor chip CHP (see FIG. 1) as the semiconductor device can be reduced.

Note that the lower electrode 16 includes the conductive film CF1 but does not include the conductive film CF2 in the first embodiment, and the lower electrode 16 includes the conductive film CF2 but does not include the conductive film CF1 in the second embodiment described later. Therefore, when the thickness FT1 of the conductive film CF1 is smaller than the thickness FT2 of the conductive film CF2, the effect of reducing the height of the upper surface of the upper electrode 23 is larger in the first embodiment than in the second embodiment.

In addition, the number of photomasks used in the manufacturing process of the semiconductor device according to the first embodiment is larger than the number of photomasks used in the manufacturing process of the semiconductor device of the comparative example by just one photomask for exposing the resist film PR1 in the process described with reference to FIG. 6.

(Second Embodiment)

The case in which the lower electrode 16 includes the conductive film CF1 but does not include the conductive film CF2 has been described in the first embodiment. Meanwhile, the case in which the lower electrode 16 includes the conductive film CF2 but does not include the conductive film CF1 will be described in the second embodiment. Note that the semiconductor device according to the second embodiment is the same as the semiconductor device according to the first embodiment except that the lower electrode 16 includes the conductive film CF2 instead of the conductive film CF1. Therefore, the capacitive element CD1 will be mainly described below and the descriptions of the parts similar to those of the first embodiment will be omitted.

<Configuration of Capacitive Element and Memory Cell>

Figure 27:
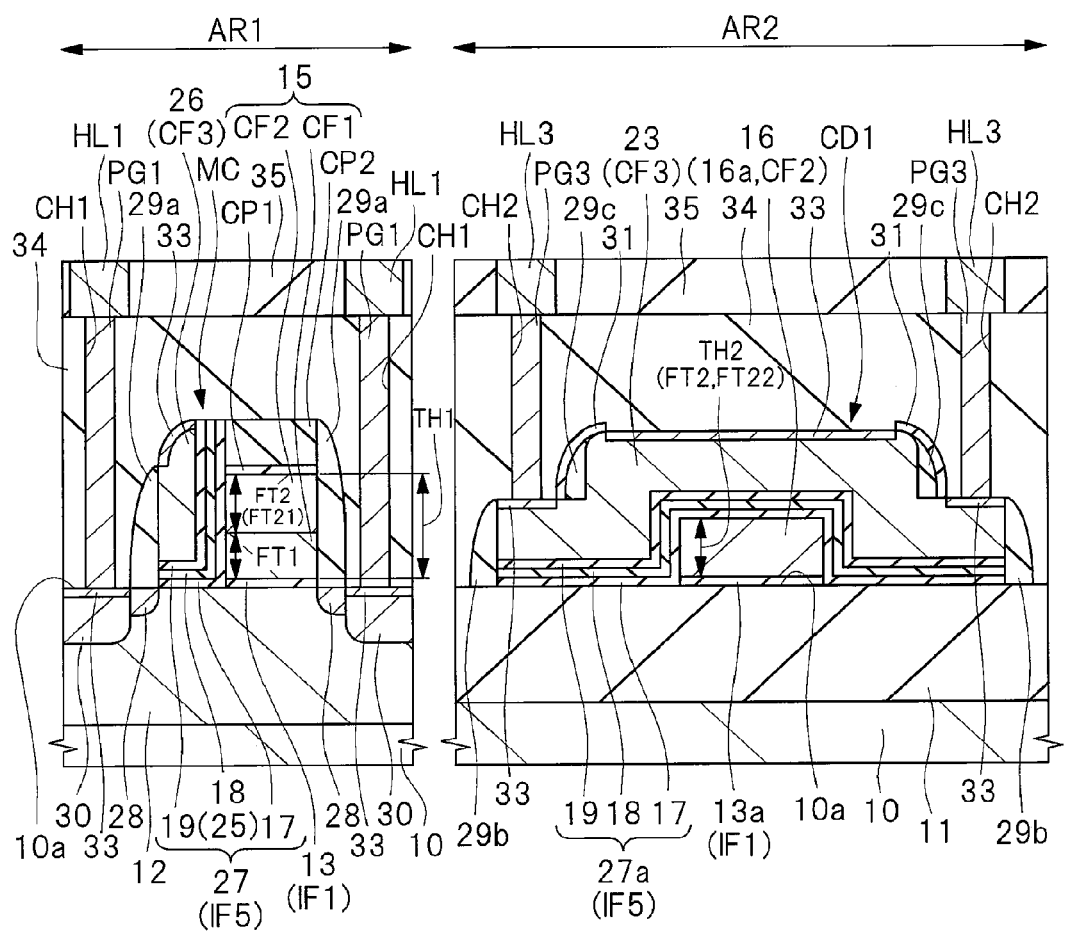
FIG. 27 is a cross-sectional view of a capacitive element and a memory cell in a semiconductor device according to the second embodiment.

FIG. 27 is a cross-sectional view of a capacitive element and a memory cell in a semiconductor device according to the second embodiment. Note that the plan view of the capacitive element in the semiconductor device according to the second embodiment is the same as FIG. 2 which is the plan view of the capacitive element in the semiconductor device according to the first embodiment, and the cross-sectional view of the capacitive element in the capacitive element forming region AR2 in FIG. 27 corresponds to the cross-sectional view taken along the line A-A in FIG. 2.

As shown in FIG. 27, the semiconductor device according to the second embodiment also includes the lower electrode 16, the upper electrode 23 and the capacitive insulating film 27a like the semiconductor device according to the first embodiment. The capacitive element CD1 is formed of the lower electrode 16, the upper electrode 23 and the capacitive insulating film 27a.

In addition, as shown in FIG. 27, the semiconductor device according to the second embodiment also includes the semiconductor substrate 10 and the element isolation region 11 like the semiconductor device according to the first embodiment. In addition, the semiconductor substrate 10 has the memory cell forming region AR1 in which the memory cell MC is formed and the capacitive element forming region AR2 in which the capacitive element CD1 is formed.

On the other hand, in the second embodiment, the insulator part 13a is formed on the element isolation region 11 instead of on the active region sandwiched between the two element isolation regions 11 in the capacitive element forming region AR2 unlike the first embodiment. The insulator part 13a includes the insulating film IF1 made of, for example, a silicon oxide film. The element isolation region 11 is formed in the upper surface 10a of the semiconductor substrate 10 in the capacitive element forming region AR2.

Further, in the capacitive element forming region AR2, the lower electrode 16 is formed on the insulator part 13a. Namely, the lower electrode 16 is formed on the element isolation region 11. The lower electrode 16 includes one layer of a conductive film, but the lower electrode 16 in the second embodiment includes the conductive film CF2 instead of the conductive film CF1 unlike the first embodiment. The conductive film CF2 is made of, for example, a polycrystalline silicon film. The conductive film CF2 is a conductive film formed in the same process as that of forming the conductive film CF2 included in the control gate electrode 15 described later. Specifically, the thickness FT2 of the conductive film CF2 can be set to, for example, about 43 to 53 nm.

In the second embodiment, in the manufacturing process described later, after the conductive film CF1 is formed in the memory cell forming region AR1 and the capacitive element forming region AR2, the conductive film CF1 is removed in the capacitive element forming region AR2 unlike the first embodiment. In this case, if the capacitive element CD1 is formed on the active region sandwiched between the two element isolation regions 11, that is, the semiconductor substrate 10 in the capacitive element forming region AR2 like the first embodiment, there is the feat that the semiconductor substrate 10 is damaged when the conductive film CF1 is etched and removed in the capacitive element forming region AR2.

Meanwhile, in the second embodiment, the capacitive element CD1 is formed on the element isolation region 11 instead of on the active region sandwiched between the two element isolation regions 11 in the capacitive element forming region AR2 unlike the first embodiment. In such a case, since the element isolation region 11 is formed between the conductive film CF1 and the semiconductor substrate 10, it is possible to prevent or suppress the semiconductor substrate 10 from being damaged when the conductive film CF1 is etched and removed in the capacitive element forming region AR2.

The capacitive insulating film 27a is formed on the lower electrode 16 and the upper electrode 23 is formed on the capacitive insulating film 27a. The capacitive insulating film 27a and the upper electrode 23 can be the same as those of the first embodiment. In addition, the wiring structure connected to the capacitive element CD1 can be the same as that of the first embodiment.

Further, the structure of the memory cell MC of the flash memory can be the same as that of the first embodiment.

For example, the control gate electrode 15 includes two layers of the conductive films CF1 and CF2 stacked in the direction perpendicular to the upper surface 10a of the semiconductor substrate 10. Each of the conductive films CF1 and CF2 is made of a polycrystalline silicon film.

Preferably, the thickness FT1 of the conductive film CF1 is smaller than the thickness FT2 of the conductive film CF2 like the first embodiment. Specifically, the conductive films CF1 and CF2 are formed so that the thickness FT1 of the conductive film CF1 is set to, for example, about 36 to 44 nm, the thickness FT2 of the conductive film CF2 is set to, for example, about 43 to 53 nm and the thickness FT1 of the conductive film CF1 is smaller than the thickness FT2 of the conductive film CF2.

In the second embodiment, the conductive film CF2 included in the control gate electrode 15 is the conductive film formed in the same process as that of forming the conductive film CF2 included in the lower electrode 16, but the conductive film CF1 included in the control gate electrode 15 is not the conductive film formed in the same process as that of forming the conductive film included in the lower electrode 16. In this respect, the second embodiment is different from the first embodiment. In other words, the lower electrode 16 includes the conductive film CF2 formed in the same process as that of forming the conductive film CF2 included in the control gate electrode 15, but does not include the conductive film formed in the same process as that of forming the conductive film CF1 included in the control gate electrode 15.

Therefore, when the thickness of the control gate electrode 15 is defined as TH1 and the thickness of the lower electrode 16 is defined as TH2, the thickness TH2 is smaller than the thickness TH1. In addition, when the thickness FT2 of the conductive film CF2 included in the control gate electrode 15 is referred to as FT21 and the thickness FT2 of the conductive film CF2 included in the lower electrode 16 is referred to as FT22, the thickness FT22 is equal to the thickness FT21 and is larger than the thickness FT1 of the conductive film CF1 included in the control gate electrode 15. Also, the conductive film CF2 included in the control gate electrode 15 and the conductive film CF2 included in the lower electrode 16 are made of the same material.

Note that the expression "the thickness FT22 is equal to the thickness FT21" means that the difference between the thickness FT22 and the thickness FT21 is within the range of ±10% with respect to the average values of the thickness FT22 and the thickness FT21.

<Manufacturing Method of Semiconductor Device>

Next, the manufacturing method of the semiconductor device according to the second embodiment will be described.

Figure 40:
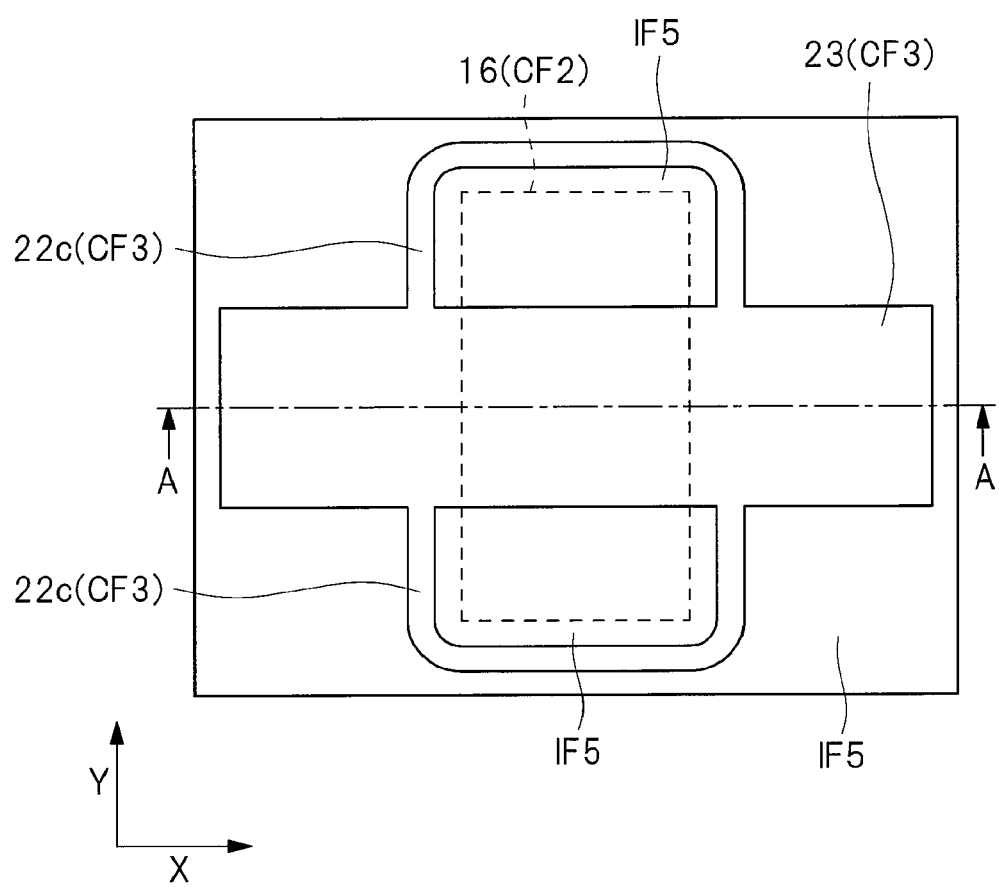
FIG. 40 is a plan view in the manufacturing process of the semiconductor device according to the second embodiment.

FIGS. 28 to 39, 41 and 42 are cross-sectional views in the manufacturing process of the semiconductor device according to the second embodiment. FIGS. 40 and 43 are plan views in the manufacturing process of the semiconductor device according to the second embodiment. FIGS. 28 to 39, 41 and 42 show the cross section corresponding to FIG. 27, and FIGS. 40 and 43 show the plane corresponding to FIG. 2.

First, the process described in the first embodiment with reference to FIG. 4 is performed to prepare the semiconductor substrate 10 and form the element isolation region 11, the p type well 12, the insulating film IF1 and the conductive film CF1. In the capacitive element forming region AR2, the element isolation region 11 is formed in the upper surface 10a serving as a main surface of the semiconductor substrate 10, and the conductive film CF1 is formed on the element isolation region 11. Specifically, the thickness FT1 of the conductive film CF1 can be set to, for example, about 36 to 44 nm.

Figure 28:
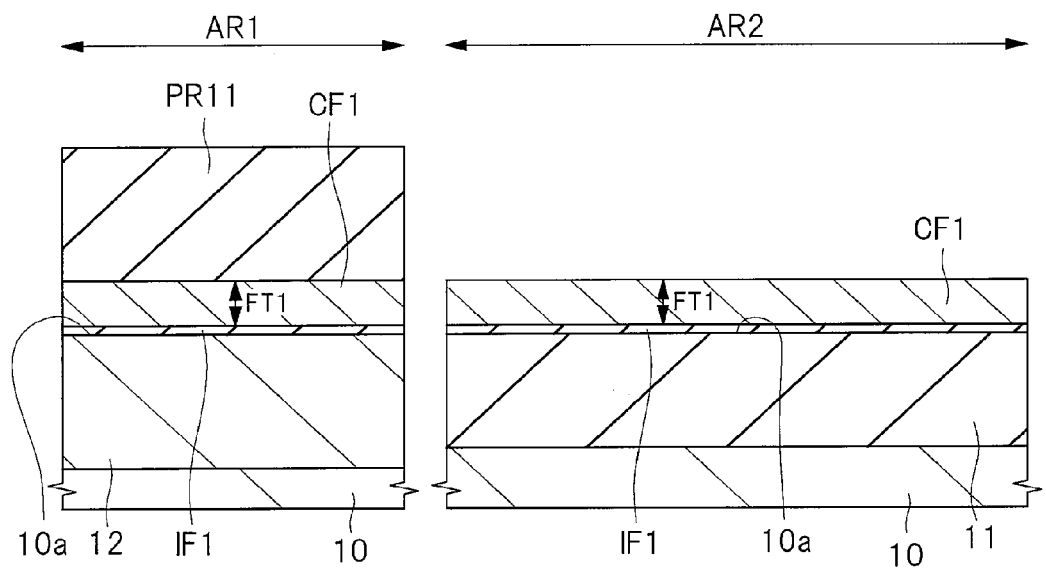
FIG. 28 is a cross-sectional view in the manufacturing process of the semiconductor device according to the second embodiment.

Next, as shown in FIG. 28, in the memory cell forming region AR1 and the capacitive element forming region AR2, a resist film PR11 is applied onto the conductive film CF1, and then the resist film PR11 is patterned by performing the exposure and development process to the resist film PR11. The resist film PR11 is patterned so that the region in which the lower electrode 16 (see FIG. 33) is to be formed in the capacitive element forming region AR2 is covered and the region other than that is exposed.

Figure 29:
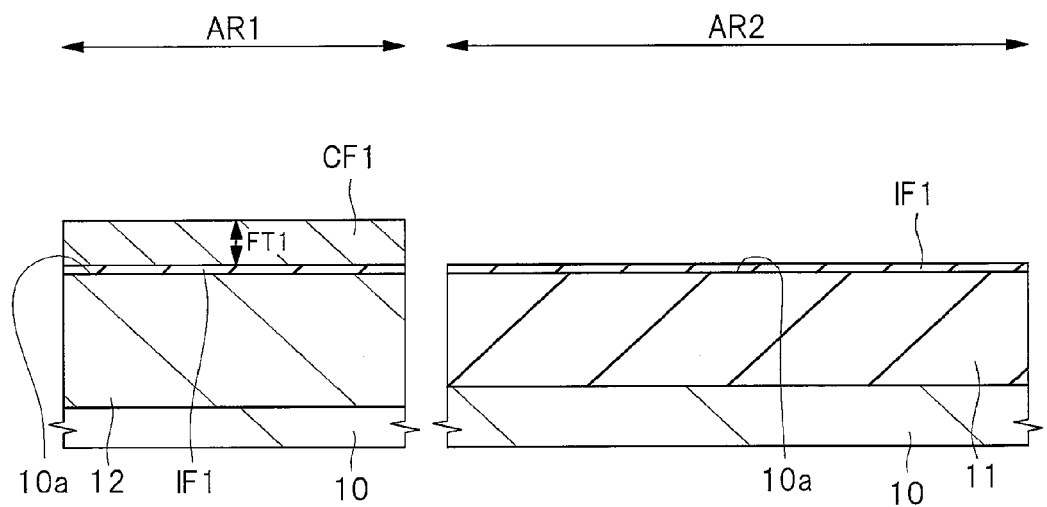
FIG. 29 is a cross-sectional view in the manufacturing process of the semiconductor device according to the second embodiment.

Next, as shown in FIG. 29, the conductive film CF1 is processed or patterned by the etching using the patterned resist film PR11 as a mask in the memory cell forming region AR1 and the capacitive element forming region AR2. Then, the conductive film CF1 is removed in the capacitive element forming region AR2, and the conductive film CF1 is left in the memory cell forming region AR1. Thereafter, the resist film PR11 is removed. As a result, the conductive film CF1 is formed on the insulating film IF1 in the memory cell forming region AR1, and the conductive film CF1 is not formed above the semiconductor substrate 10 in the capacitive element forming region AR2.

Next, as shown in FIG. 30, in the memory cell forming region AR1 and the capacitive element forming region AR2, the conductive film CF2 made of, for example, a polycrystalline silicon film is formed on the conductive film CF1 and on the insulating film IF1. In other words, in the memory cell forming region AR1 and the capacitive element forming region AR2, the conductive film CF2 covering the conductive film CF1 is formed above the semiconductor substrate 10. The conductive film CF2 made of a polycrystalline silicon film can be formed by, for example, the CVD method. Then, by using the photolithography technique and the ion implantation method, an n type impurity such as phosphorus or arsenic is introduced into the conductive film CF2 made of a polycrystalline silicon film. Specifically, the thickness FT2 of the conductive film CF2 can be set to, for example, about 43 to 53 nm. Note that the thickness FT2 of a part of the conductive film CF2 formed in the memory cell forming region AR1 is referred to as FT21 and the thickness FT2 of a part of the conductive film CF2 formed in the capacitive element forming region AR2 is referred to as FT22.

Then, the process similar to that described in the first embodiment with reference to FIG. 9 is performed to form the insulating film IF4 containing silicon and nitrogen on the conductive film CF2 as shown in FIG. 31. Note that the insulating film IF3 made of a silicon oxide film may be formed between the conductive film CF2 and the insulating film IF4, and the case in which the insulating film IF3 is formed between the conductive film CF2 and the insulating film IF4 will be described below.

Figure 32:
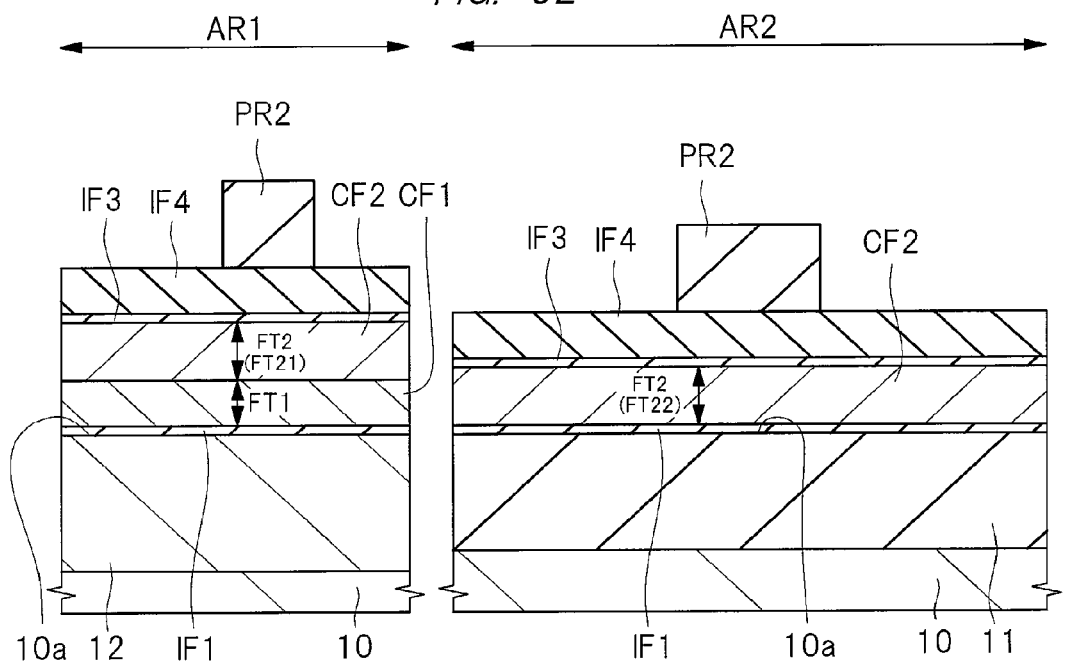
FIG. 32 is a cross-sectional view in the manufacturing process of the semiconductor device according to the second embodiment.

Next, as shown in FIG. 32, after the resist film PR2 is applied onto the insulating film IF4 in the memory cell forming region AR1 and the capacitive element forming region AR2, the resist film PR2 is patterned by performing the exposure and development process to the resist film PR2. The resist film PR2 is patterned so that the region in which the control gate electrode 15 (see FIG. 33 described later) is to be formed in the memory cell forming region AR1 and the region in which the lower electrode 16 (see FIG. 33 described later) is to be formed in the capacitive element forming region AR2 are covered and the region other than those is exposed.

Figure 33:
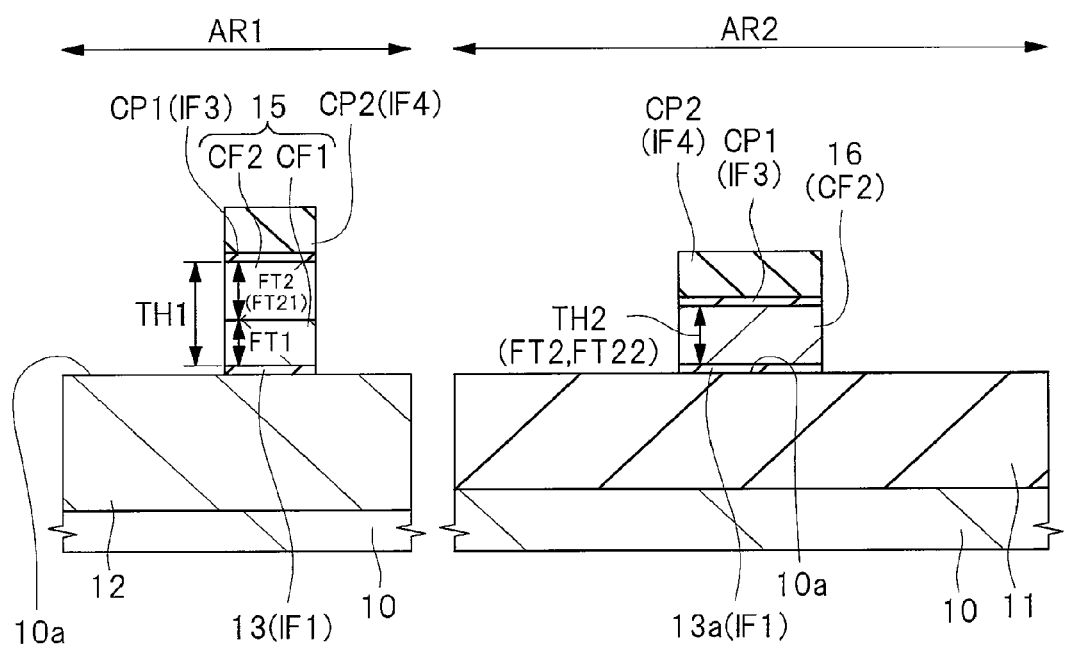
FIG. 33 is a cross-sectional view in the manufacturing process of the semiconductor device according to the second embodiment.

Next, as shown in FIG. 33, the insulating film IF3, the conductive films CF2 and CF1 and the insulating film IF1 are processed or patterned by the etching using the patterned resist film PR2 as a mask in the memory cell forming region AR1 and the capacitive element forming region AR2. Then, in the memory cell forming region AR1, the control gate electrode 15 including the conductive films CF1 and CF2, the gate insulating film 13 including the insulating film IF1 between the control gate electrode 15 and the semiconductor substrate 10, and the cap insulating film CP2 including the insulating film IF4 above the control gate electrode 15 are formed. On the other hand, in the capacitive element forming region AR2, the lower electrode 16 including the conductive film CF2, the insulator part 13a made of the insulating film IF1 between the lower electrode 16 and the element isolation region 11, and the cap insulating film CP2 including the insulating film IF4 above the lower electrode 16 are formed. Thereafter, the resist film PR2 is removed. Note that the cap insulating film CP1 made of the insulating film IF3 between the cap insulating film CP2 and the control gate electrode 15 may be formed and the cap insulating film CP1 made of the insulating film IF3 between the cap insulating film CP2 and the lower electrode 16 may be formed.

As described above, in the second embodiment, the conductive film CF2 included in the lower electrode 16 of the capacitive element CD1 is formed in the same process as that of forming the conductive film CF2 included in the control gate electrode 15 of the memory cell MC.

When the insulating film IF3 is formed between the conductive film CF2 and the insulating film IF4 in the memory cell forming region AR1, the cap insulating film CP1 as an insulator part including the insulating film IF3 between the control gate electrode 15 and the cap insulating film CP2 is formed. In addition, when the insulating film IF3 is formed between the conductive film CF2 and the insulating film IF4 in the capacitive element forming region AR2, the cap insulating film CP1 as an insulator part including the insulating film IF3 between the lower electrode 16 and the cap insulating film CP2 is formed.

Figure 34:
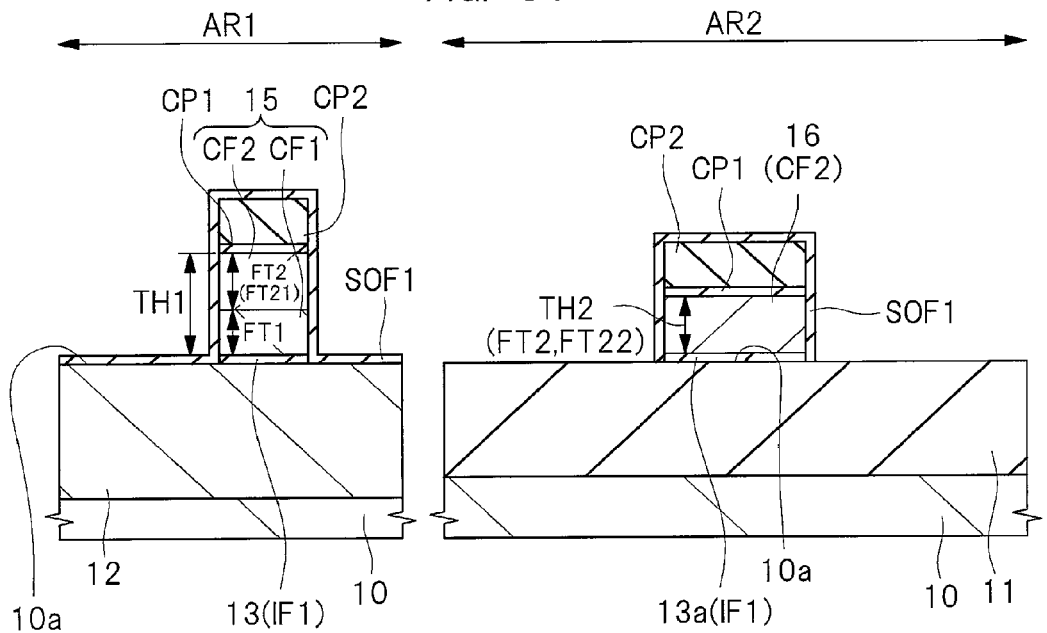
FIG. 34 is a cross-sectional view in the manufacturing process of the semiconductor device according to the second embodiment.

Next, the process similar to that described in the first embodiment with reference to FIG. 12 is performed to oxidize the upper surface 10a of the semiconductor substrate 10 and the side surface of the control gate electrode 15, thereby forming the sacrificial oxide film SOF1 in the memory cell forming region AR1 as shown in FIG. 34. Also, the side surface of the lower electrode 16 is oxidized to form the sacrificial oxide film SOF1 in the capacitive element forming region AR2. Then, an n type impurity such as phosphorus (P) or arsenic (As) is introduced by the ion implantation method into the p type well 12 with using the cap insulating film CP2 and the control gate electrode 15 having the sacrificial oxide film SOF1 formed on the side surface thereof as a mask.

Figure 35:
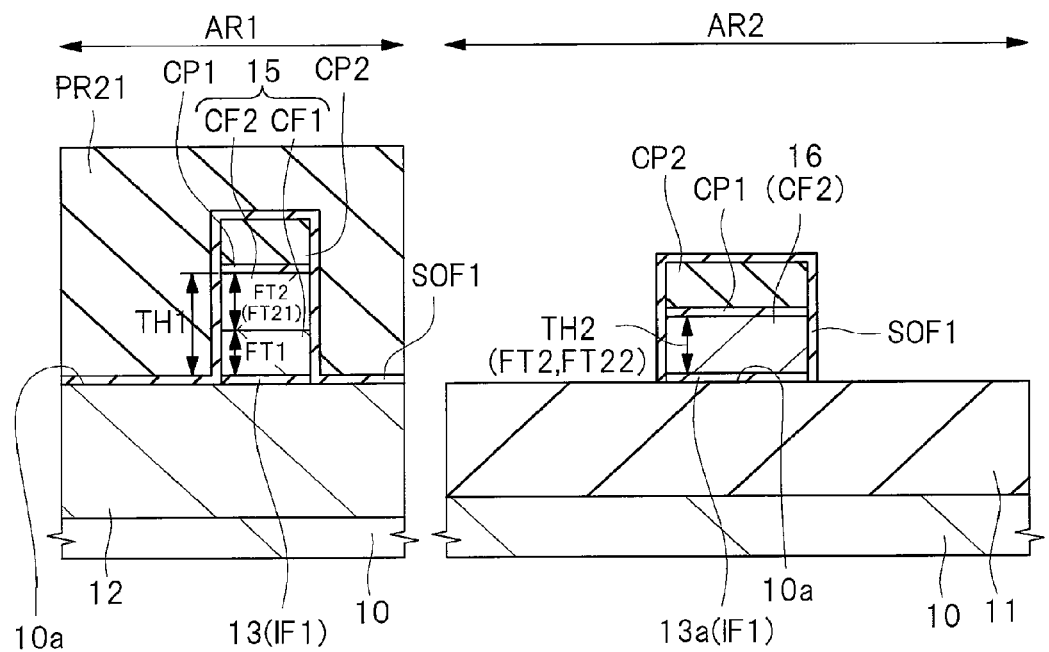
FIG. 35 is a cross-sectional view in the manufacturing process of the semiconductor device according to the second embodiment.

Next, as shown in FIG. 35, after a resist film PR21 is applied onto the semiconductor substrate 10 in the memory cell forming region AR1 and the capacitive element forming region AR2, the resist film PR21 is patterned by performing the exposure and development process to the resist film PR21. The resist film PR21 is patterned so that the capacitive element forming region AR2 is exposed and the memory cell forming region AR1 is covered.

Figure 36:
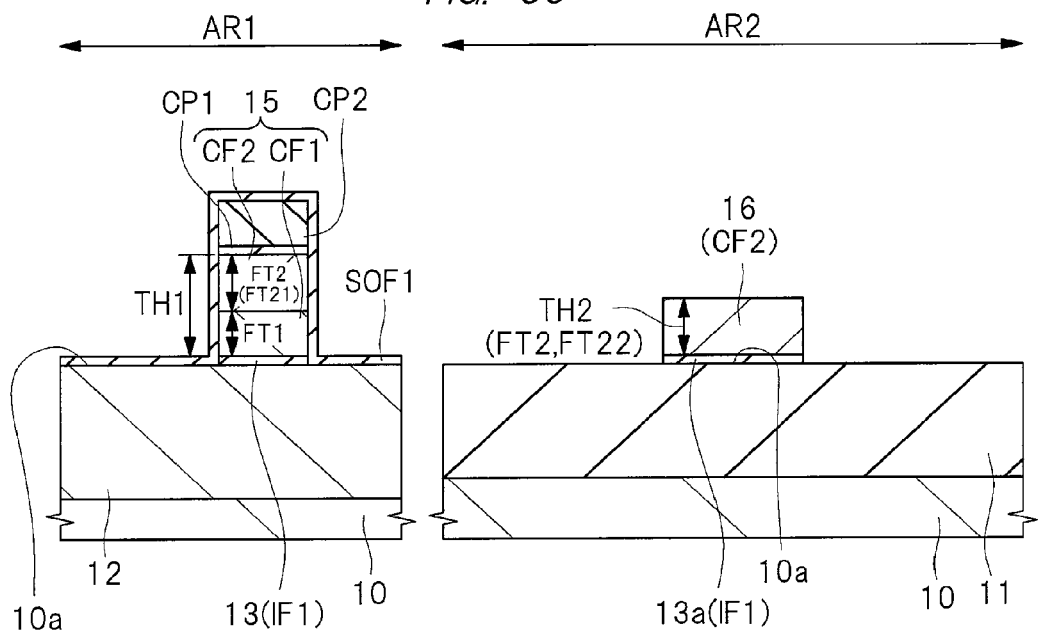
FIG. 36 is a cross-sectional view in the manufacturing process of the semiconductor device according to the second embodiment.

Next, as shown in FIG. 36, in the memory cell forming region AR1 and the capacitive element forming region AR2, the cap insulating film CP2 is processed or patterned by the etching using the patterned resist film PR21 (see FIG. 35) as a mask. Then, the cap insulating film CP2 is removed in the capacitive element forming region AR2. Thereafter, the resist film PR21 is removed.

When the cap insulating film CP1 is formed between the conductive film CF2 and the cap insulating film CP2 in the capacitive element forming region AR2, the cap insulating film CP1 is removed. In addition, the sacrificial oxide film SOF1 is removed in the capacitive element forming region AR2.

Figure 37:
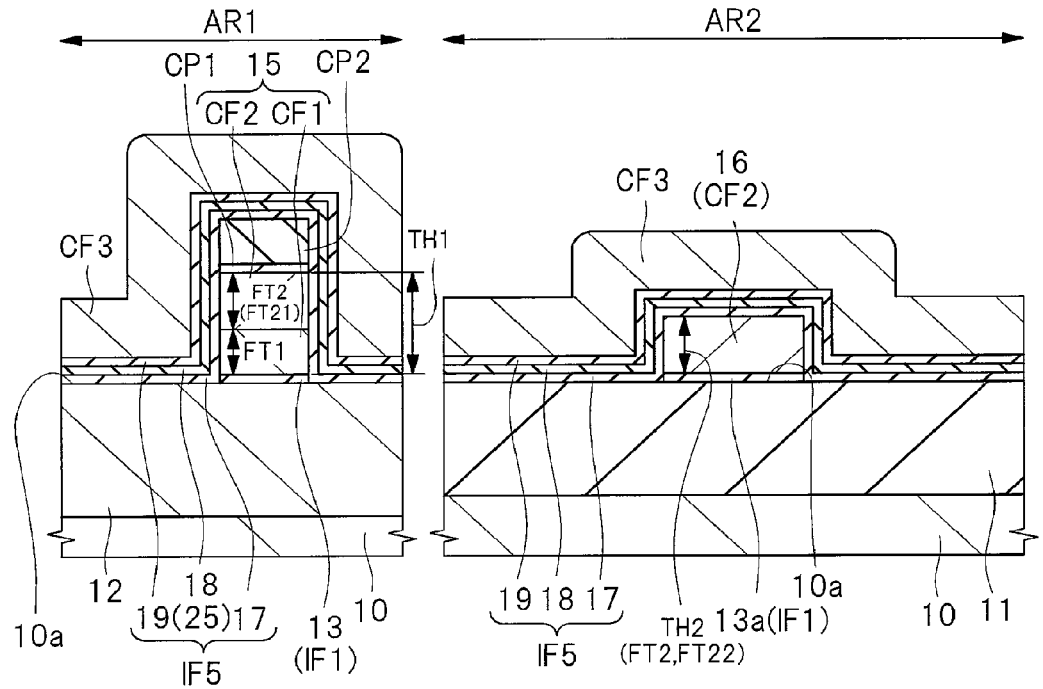
FIG. 37 is a cross-sectional view in the manufacturing process of the semiconductor device according to the second embodiment.

Next, the process similar to that described in the first embodiment with reference to FIG. 13 is performed to form the insulating film IF5 on the semiconductor substrate 10 including the surface of the control gate electrode 15 and the surface of the lower electrode 16 in the memory cell forming region AR1 and the capacitive element forming region AR2 as shown in FIG. 37. In other words, the insulating film IF5 which covers the control gate electrode 15 and the lower electrode 16 and has the charge accumulating part therein is formed. In addition, the process similar to that described in the first embodiment with reference to FIG. 13 is performed to form the conductive film CF3 made of, for example, a polycrystalline silicon film on the insulating film IF5 in the memory cell forming region AR1 and the capacitive element forming region AR2 as shown in FIG. 37.

Next, the process similar to that described in the first embodiment with reference to FIG. 14 is performed to apply the resist film PR3 onto the conductive film CF3 in the memory cell forming region AR1 and the capacitive element forming region AR2 as shown in FIG. 38 and then pattern the resist film PR3. The resist film PR3 is patterned so that the region in which the upper electrode 23 (see FIG. 39 described later) is to be formed in the capacitive element forming region AR2 is covered and the region other than that is exposed.

Next, the process similar to that described in the first embodiment with reference to FIG. 15 is performed to etch back the conductive film CF3 made of, for example, a polycrystalline silicon film by anisotropic etching in the memory cell forming region AR1 and the capacitive element forming region AR2 as shown in FIG. 39. Consequently, in the memory cell forming region AR1, the sidewalls 22a and 22b including the conductive film CF3 are left on both side walls or side surfaces of the control gate electrode 15 via the insulating film IF5.

Meanwhile, in the capacitive element forming region AR2, the upper electrode 23 including the conductive film CF3 is formed above the lower electrode 16 including the conductive film CF2 via the insulating film IF5.

Also, in the capacitive element forming region AR2, the sidewall 22c including the conductive film CF3 is left on a peripheral side surface of the lower electrode 16 including the conductive film CF2 via the insulating film IF5 as shown in FIG. 39 and FIG. 40.

Figure 41:
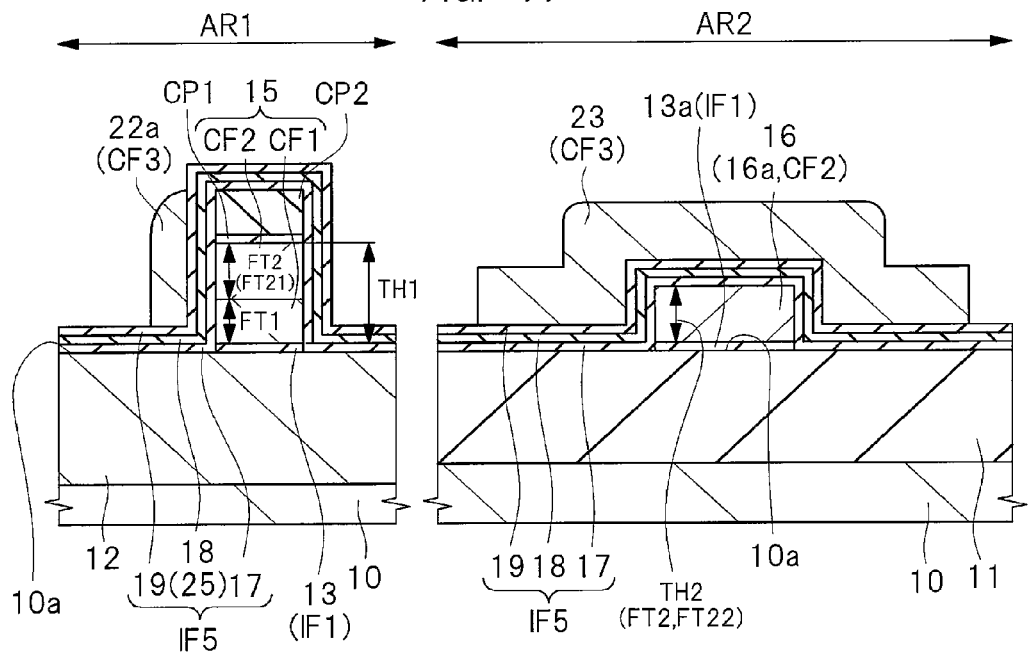
FIG. 41 is a cross-sectional view in the manufacturing process of the semiconductor device according to the second embodiment.

Next, the process similar to that described in the first embodiment with reference to FIG. 17 is performed to remove the sidewall 22b (see FIG. 39) exposed on the left side wall of the control gate electrode 15 in the memory cell forming region AR1 as shown in FIG. 41. In addition, the sidewall 22c (see FIG. 40) exposed on the peripheral side surface of the lower electrode 16 is removed in the capacitive element forming region AR2.

Figure 42:
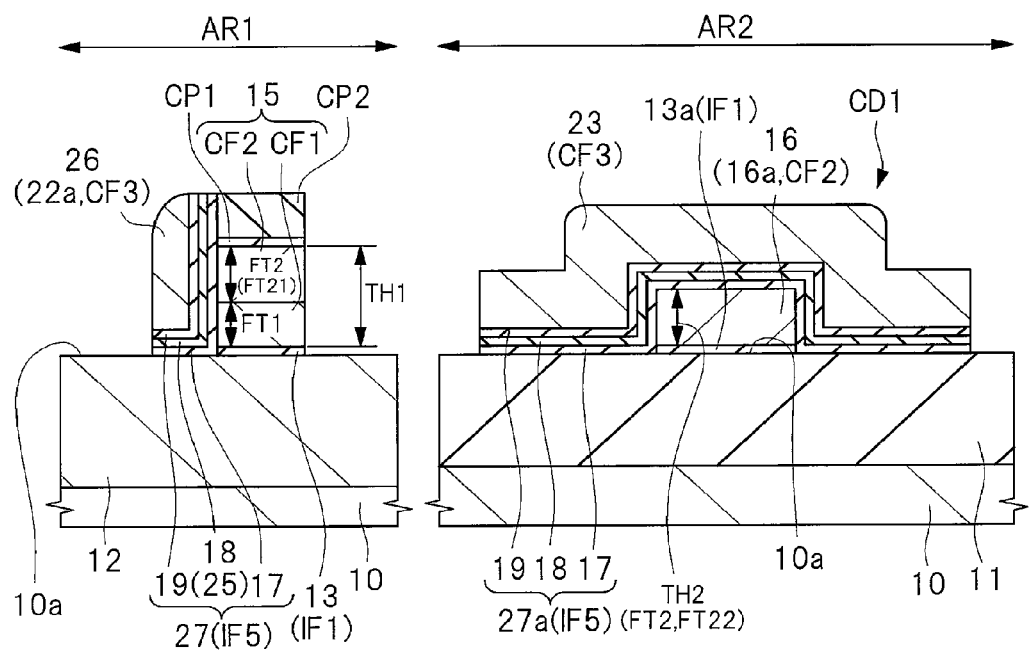
FIG. 42 is a cross-sectional view in the manufacturing process of the semiconductor device according to the second embodiment.
Figure 43:
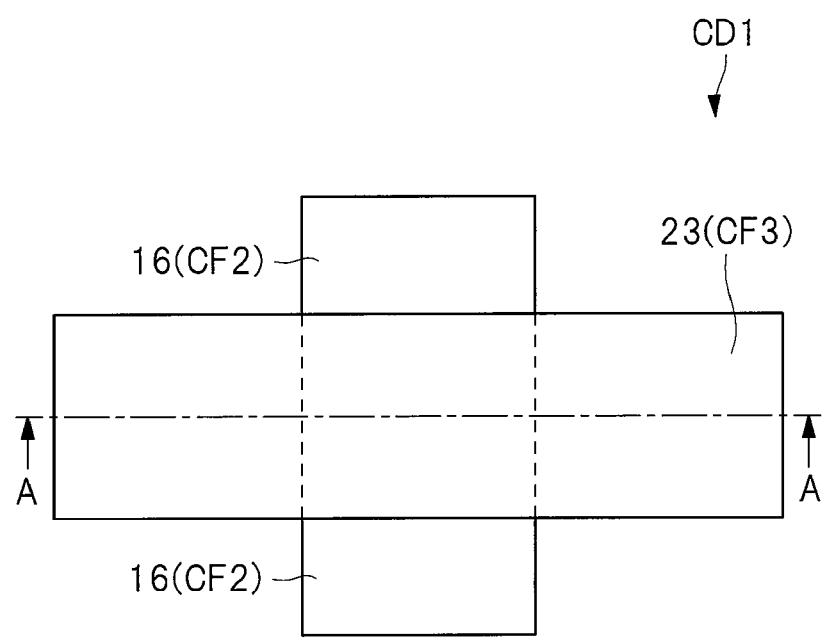
FIG. 43 is a plan view in the manufacturing process of the semiconductor device according to the second embodiment.

Next, the process similar to that described in the first embodiment with reference to FIG. 18 is performed to leave the sidewall 22a including the conductive film CF3 only on the left side wall of the control gate electrode 15 via the insulating film IF5, so that the memory gate electrode 26 with a sidewall shape is formed in the memory cell forming region AR1 as shown in FIG. 42. In addition, the part of the insulating film IF5 between the control gate electrode 15 and the memory gate electrode 26 and the part of the insulating film IF5 between the memory gate electrode 26 and the semiconductor substrate 10 are left, and the insulating film 27 serving as a gate insulating film including the remaining insulating film IF5 is formed.

On the other hand, in the capacitive element forming region AR2, the part of the insulating film IF5 between the lower electrode 16 and the upper electrode 23 and the part of the insulating film IF5 between the upper electrode 23 and the semiconductor substrate 10 are left, and the capacitive insulating film 27a including the remaining insulating film IF5 is formed. Thus, the capacitive element is formed of the lower electrode 16, the upper electrode 23 and the capacitive insulating film 27a. Note that the insulating film IF5 (see FIG. 40) exposed on the peripheral side surface of the lower electrode 16 is also removed as shown in FIG. 43.

Next, the process similar to that described in the first embodiment with reference to FIG. 20 is performed to form the shallow low concentration impurity diffusion regions 28 in alignment with the control gate electrode 15 and the memory gate electrode 26 in the memory cell forming region AR1 as shown in FIG. 27.

Next, the process similar to that described in the first embodiment with reference to FIG. 21 is performed to form the sidewalls 29a, 29b and 29c as shown in FIG. 27.

Next, the process similar to that described in the first embodiment with reference to FIG. 22 is performed to form the deep high concentration impurity diffusion regions 30 in the memory cell forming region AR1 as shown in FIG. 27. The source region and the drain region are formed of the deep high concentration impurity diffusion regions 30 and the shallow low concentration impurity diffusion regions 28. Also, the memory cell MC is formed of the control gate electrode 15, the gate insulating film 13, the memory gate electrode 26 and the insulating film 27.

Next, the process similar to that described in the first embodiment with reference to FIGS. 23 to 25 is performed to form the metal silicide film 33 on the surfaces of the memory gate electrode 26, the upper electrode 23 and the high concentration impurity diffusion regions 30 serving as the source and drain regions as shown in FIG. 27.

Next, the process similar to that described in the first embodiment with reference to FIG. 3 is performed to form the interlayer insulating film 34, the contact holes CH1 and CH2, the plugs PG1, PG2 (see FIG. 2) and PG3, and the wirings HL1, HL2 (see FIG. 2) and HL3. In this manner, the semiconductor device according to the second embodiment is finally formed.

<Main Characteristics and Effects of Present Embodiment>

In the semiconductor device according to the second embodiment, the conductive film CF2 included in the lower electrode 16 is formed in the same process as that of forming the conductive film CF2 included in the control gate electrode 15, but the lower electrode 16 does not include the conductive film formed in the same process as that of forming the conductive film CF1 included in the control gate electrode 15.

Therefore, in the semiconductor device according to the second embodiment, the thickness TH2 of the lower electrode 16 which includes the conductive film CF2 but does not include the conductive film CF1 is smaller than the thickness TH1 of the control gate electrode 15 including the conductive film CF1 and the conductive film CF2. Also in such a case, the height position of the upper surface of the lower electrode 16 is lower than the height position of the upper surface of the control gate electrode 15 like the first embodiment. Therefore, the height position of the upper surface of the upper electrode 23, that is, the height position of the upper surface of the capacitive element CD1 can be made lower than the height position of the upper surface of the cap insulating film CP2, that is, the height position of the upper surface of the memory cell MC.

The thickness of the insulating film IF1 is set to, for example, about 41 to 51 nm, the thickness TH2 of the conductive film CF2, that is, the lower electrode 16 is set to, for example, about 43 to 53 nm, the thickness of the insulating film IF5 is set to, for example, about 18 to 22 nm, and the thickness of the conductive film CF3, that is, the upper electrode 23 is set to, for example, about 52 to 64 nm. Meanwhile, the thickness FT1 of the conductive film CF1 is set to, for example, about 36 to 44 nm. In such a case, in the second embodiment, the height from the upper surface 10a of the semiconductor substrate 10 to the upper surface of the upper electrode 23 is, for example, about 154 to 190 nm by adding up the thicknesses of each of the insulating film IF1, the conductive film CF2, the insulating film IF5 and the conductive film CF3. On the other hand, in the comparative example described in the first embodiment above, the height from the upper surface 10a of the semiconductor substrate 10 to the upper surface of the upper electrode 23 is, for example, about 190 to 234 nm in the same manner. Therefore, in the semiconductor device according to the second embodiment, the height of the upper surface of the upper electrode 23 can be lowered by the thickness FT1 of the conductive film CF1, that is, about 36 to 44 nm in comparison with the semiconductor device of the comparative example.

Also in the second embodiment, even when the thickness of the interlayer insulating film 34 is reduced in comparison with the comparative example, the upper surface of the interlayer insulating film 34 can be sufficiently separated upward from the upper surface of the conductive element CD1 like the first embodiment. Further, also in the second embodiment, the thickness of the interlayer insulating film 34 can be reduced in comparison with the comparative example like the first embodiment. Therefore, the positional accuracy of the bottom portion of the contact hole CH2 can be improved when forming the contact hole CH2 and the electric conduction between the plug PG3 and the upper electrode 23 can be reliably established, so that the performance of the semiconductor device can be improved.

In addition, also in the second embodiment, even when the thickness of the interlayer insulating film 34 is reduced in comparison with the comparative example, it is possible to prevent the upper surface of the upper electrode 23 from being exposed when planarizing the interlayer insulating film 34 like the first embodiment. Therefore, it is possible to prevent the occurrence of the short-circuit due to the electric conduction between the wiring formed above the capacitive element CD1 and the upper electrode 23, so that the performance of the semiconductor device can be improved. Furthermore, it is possible to dispose the wiring also on a part of the interlayer insulating film 34 overlapped with the capacitive element CD1 when seen in a plan view, and thus the area of the semiconductor chip CHP (see FIG. 1) as the semiconductor device can be reduced.

As described above, however, the capacitive element CD1 is formed on the element isolation region 11 instead of on the active region sandwiched between the two element isolation regions 11 in the capacitive element forming region AR2 in order to prevent the semiconductor substrate 10 from being damaged when the conductive film CF1 is removed in the capacitive element forming region AR2. Therefore, the configuration of the semiconductor device according to the second embodiment is limited in comparison with the configuration of the semiconductor device according to the first embodiment in the respect that the capacitive element CD2 (see FIG. 3) cannot be provided.

Note that, in the second embodiment, the process described with reference to FIG. 29 is performed to remove the conductive film CF1 and the process described with reference to FIG. 30 is performed to form the conductive film CF2 in the capacitive element forming region AR2, and then the process described with reference to FIGS. 31 to 33 is performed to form the lower electrode 16 including the conductive film CF2.

Alternatively, the conductive film CF1 is thinned instead of being removed when the process described with reference to FIG. 29 is performed in the capacitive element forming region AR2 and the conductive film CF2 is formed on the thinned conductive film CF1 by performing the process described with reference to FIG. 30. Herewith, the lower electrode 16 including the conductive film CF2 and the thinned conductive film CF1 may be formed by performing the process described with reference to FIGS. 31 to 33.

Namely, in the semiconductor device according to the second embodiment, the lower electrode 16 may include the conductive film obtained by thinning the conductive film formed in the same process as that of forming the conductive film included in the control gate electrode 15. In other words, in the semiconductor device according to the second embodiment, the lower electrode 16 may include a part of the conductive film in the thickness direction formed in the same process as that of forming the conductive film included in the control gate electrode 15.

In the foregoing, the invention made by the inventors of the present invention has been concretely described based on the embodiments. However, it is needless to say that the present invention is not limited to the foregoing embodiments and various modifications and alterations can be made within the scope of the present invention.

What is claimed is:

1. A manufacturing method of a semiconductor device comprising:
   (a) preparing a semiconductor substrate;
   (b) forming a first insulating film on the semiconductor substrate in a first region of a main surface of the semiconductor substrate;
   (c) forming a first conductive film covering the first insulating film above the semiconductor substrate in the first region and a second region of the main surface of the semiconductor substrate;
   (d) forming a second conductive film on the first conductive film;
   (e) patterning the second conductive film and the first conductive film to form a first gate electrode including the first conductive film and the second conductive film and forming a first gate insulating film including the first insulating film between the first gate electrode and the semiconductor substrate in the first region, and removing the second conductive film and patterning the first conductive film to form a first electrode including the first conductive film in the second region;
   (f) forming a second insulating film which covers the first gate electrode and the first electrode and has a charge accumulating part therein;
   (g) forming a third conductive film on the second insulating film; and
   (h) etching back the third conductive film to leave the third conductive film on a side surface of the first gate electrode via the second insulating film, thereby forming a second gate electrode in the first region, and patterning the third conductive film to form a second electrode above the first electrode in the second region,
   wherein, in (h), a second gate insulating film including the second insulating film between the second gate electrode and the semiconductor substrate and between the second gate electrode and the first gate electrode is formed, and a first insulator part including the second insulating film between the second electrode and the first electrode is formed,
   a nonvolatile memory is formed of the first gate electrode, the first gate insulating film, the second gate electrode and the second gate insulating film,
   a first capacitive element is formed of the first electrode, the second electrode and the first insulator part, and
   a thickness of the first electrode is smaller than a thickness of the first gate electrode.

2. The manufacturing method of a semiconductor device according to claim 1,
   wherein (d) includes:
   (d1) forming a third insulating film on the first conductive film;
   (d2) removing the third insulating film in the first region and patterning the third insulating film to form a second insulator part in the second region; and
   (d3) forming the second conductive film covering the second insulator part on the first conductive film, and
   in (e), the first conductive film is patterned using the second insulator part as a mask in the second region.

3. The manufacturing method of a semiconductor device according to claim 1,
   wherein, in (b), the first insulating film is formed on the semiconductor substrate in the second region,
   in (e), a third insulator part including the first insulating film between the first electrode and the semiconductor substrate is formed, and
   a second capacitive element is formed of the first electrode, the semiconductor substrate below the first electrode and the third insulator part.

4. A manufacturing method of a semiconductor device comprising:
   (a) preparing a semiconductor substrate;
   (b) forming a first insulating film on the semiconductor substrate in a first region of a main surface of the semiconductor substrate;
   (c) forming a first conductive film on the first insulating film in the first region and forming no first conductive film above the semiconductor substrate in a second region of the main surface of the semiconductor substrate;
   (d) forming a second conductive film covering the first conductive film above the semiconductor substrate in the first region and the second region;
   (e) patterning the second conductive film and the first conductive film to form a first gate electrode including the first conductive film and the second conductive film and forming a first gate insulating film including the first insulating film between the first gate electrode and the semiconductor substrate in the first region, and patterning the second conductive film to form a first electrode including the second conductive film in the second region;
   (f) forming a second insulating film which covers the first gate electrode and the first electrode and has a charge accumulating part therein;
   (g) forming a third conductive film on the second insulating film; and
   (h) etching back the third conductive film to leave the third conductive film on a side surface of the first gate electrode via the second insulating film, thereby forming a second gate electrode in the first region, and patterning the third conductive film to form a second electrode above the first electrode in the second region,
   wherein, in (h), a second gate insulating film including the second insulating film between the second gate electrode and the semiconductor substrate and between the second gate electrode and the first gate electrode is formed, and an insulator part including the second insulating film between the second electrode and the first electrode is formed,
   a nonvolatile memory is formed of the first gate electrode, the first gate insulating film, the second gate electrode and the second gate insulating film,
   a capacitive element is formed of the first electrode, the second electrode and the insulator part, and
   a thickness of the first electrode is smaller than a thickness of the first gate electrode.

5. The manufacturing method of a semiconductor device according to claim 4, further comprising:
   (i) after (a) and before (b), forming an element isolation region in the main surface of the semiconductor substrate in the second region,
   wherein, in (c), the first conductive film is formed on the element isolation region.

* * * * *